US011114529B2

(12) United States Patent
Chiang et al.

(10) Patent No.: US 11,114,529 B2
(45) Date of Patent: Sep. 7, 2021

(54) GATE-ALL-AROUND FIELD-EFFECT TRANSISTOR DEVICE

(71) Applicant: Taiwan Semiconductor Manufacturing Company, Ltd., Hsinchu (TW)

(72) Inventors: Kuo-Cheng Chiang, Zhubei (TW); Huan-Chieh Su, Tianzhong Township (TW); Shi Ning Ju, Hsinchu (TW); Kuan-Ting Pan, Taipei (TW); Chih-Hao Wang, Baoshan Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/550,049

(22) Filed: Aug. 23, 2019

(65) Prior Publication Data
US 2021/0057525 A1 Feb. 25, 2021

(51) Int. Cl.
*H01L 29/06* (2006.01)
*H01L 21/02* (2006.01)
(Continued)

(52) U.S. Cl.
CPC ...... *H01L 29/0673* (2013.01); *H01L 21/0262* (2013.01); *H01L 21/02532* (2013.01);
(Continued)

(58) Field of Classification Search
CPC .......... H01L 29/0673; H01L 21/31111; H01L 29/0886; H01L 29/401; H01L 21/823437;
(Continued)

(56) References Cited

U.S. PATENT DOCUMENTS 9,953,881 B2 4/2018 Ching et al.
10,566,330 B2 2/2020 Rodder et al.
(Continued)

FOREIGN PATENT DOCUMENTS

| KR | 20170010707 A | 2/2017 |
| TW | 201917891 A | 5/2019 |
| TW | 201929225 A | 7/2019 |

*Primary Examiner* — Su C Kim
(74) *Attorney, Agent, or Firm* — Slater Matsil, LLP

(57) ABSTRACT

A method of forming a semiconductor device includes forming semiconductor strips protruding above a substrate and isolation regions between the semiconductor strips; forming hybrid fins on the isolation regions, the hybrid fins comprising dielectric fins and dielectric structures over the dielectric fins; forming a dummy gate structure over the semiconductor strip; forming source/drain regions over the semiconductor strips and on opposing sides of the dummy gate structure; forming nanowires under the dummy gate structure, where the nanowires are over and aligned with respective semiconductor strips, and the source/drain regions are at opposing ends of the nanowires, where the hybrid fins extend further from the substrate than the nanowires; after forming the nanowires, reducing widths of center portions of the hybrid fins while keeping widths of end portions of the hybrid fins unchanged, and forming an electrically conductive material around the nanowires.

20 Claims, 25 Drawing Sheets

(51) Int. Cl.
  *H01L 21/308* (2006.01)
  *H01L 21/8234* (2006.01)
  *H01L 29/66* (2006.01)
  *H01L 21/311* (2006.01)
  *H01L 21/3065* (2006.01)
  *H01L 29/40* (2006.01)
  *H01L 29/423* (2006.01)
  *H01L 29/49* (2006.01)
  *H01L 29/08* (2006.01)
  *H01L 21/762* (2006.01)
  *H01L 29/10* (2006.01)

(52) U.S. Cl.
  CPC ...... *H01L 21/3065* (2013.01); *H01L 21/3086* (2013.01); *H01L 21/31111* (2013.01); *H01L 21/76224* (2013.01); *H01L 21/823431* (2013.01); *H01L 21/823437* (2013.01); *H01L 21/823481* (2013.01); *H01L 29/0847* (2013.01); *H01L 29/0886* (2013.01); *H01L 29/1033* (2013.01); *H01L 29/401* (2013.01); *H01L 29/42392* (2013.01); *H01L 29/495* (2013.01); *H01L 29/66545* (2013.01)

(58) Field of Classification Search
  CPC ......... H01L 21/0262; H01L 21/823481; H01L 29/0847; H01L 21/76224; H01L 29/1033; H01L 21/823431; H01L 29/42392; H01L 29/495; H01L 21/3065; H01L 21/3086; H01L 21/02532; H01L 29/66545; H01L 29/66439; H01L 29/66469; H01L 51/057; H01L 2924/10325; H01L 2924/13061; H01L 2924/13086; H01L 2924/13088; H01L 2924/1308
  See application file for complete search history.

(56) References Cited

U.S. PATENT DOCUMENTS

| | | | |
|---|---|---|---|
| 10,868,127 | B2 | 12/2020 | Cheng et al. |
| 2006/0240622 | A1* | 10/2006 | Lee .................. H01L 29/78645 438/257 |
| 2014/0312427 | A1 | 10/2014 | Maeda et al. |
| 2017/0110554 | A1* | 4/2017 | Tak .................. H01L 29/42392 |
| 2017/0250291 | A1* | 8/2017 | Lee .................... H01L 29/0665 |
| 2017/0256457 | A1 | 9/2017 | Deng et al. |
| 2018/0248015 | A1* | 8/2018 | Glass .................... H01L 29/78 |
| 2018/0277665 | A1 | 9/2018 | Chen et al. |
| 2019/0355721 | A1* | 11/2019 | Jambunathan ...... H01L 29/7848 |

* cited by examiner

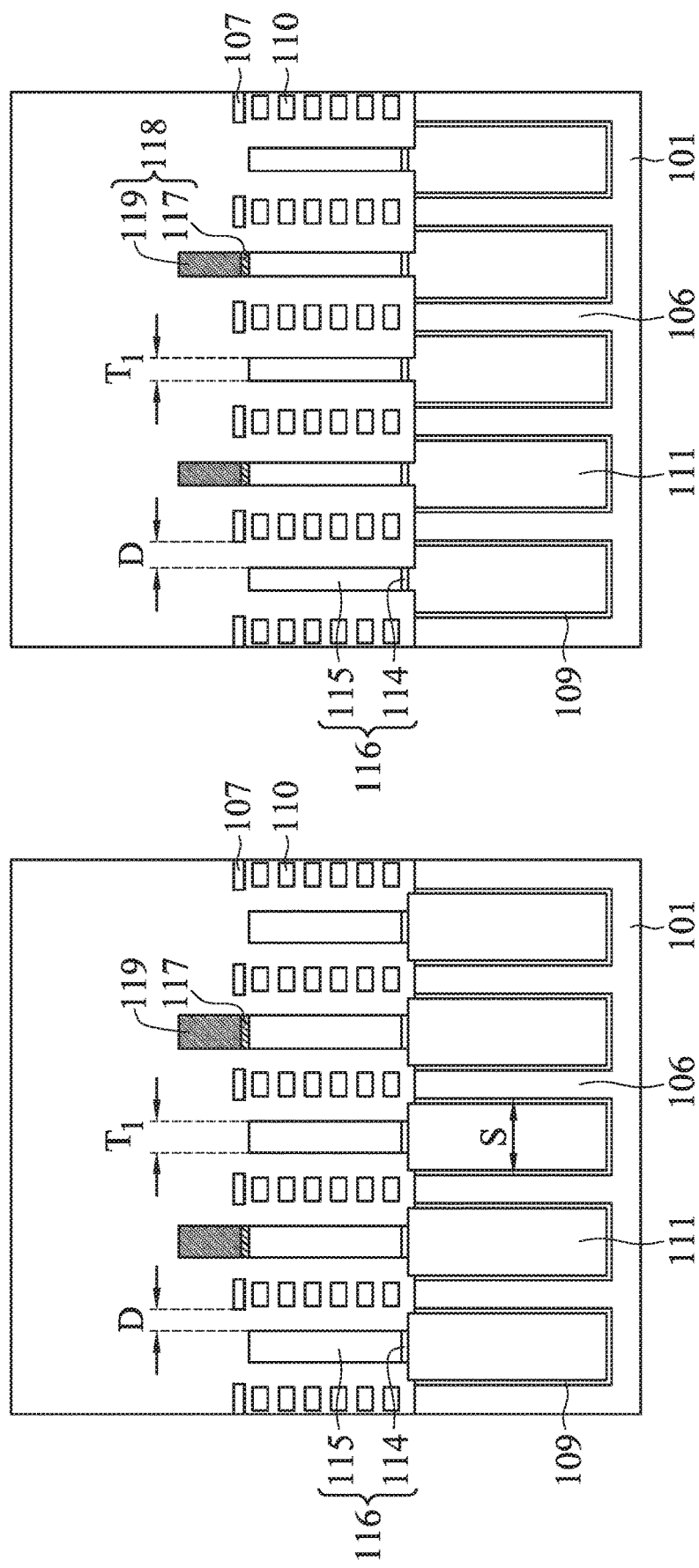

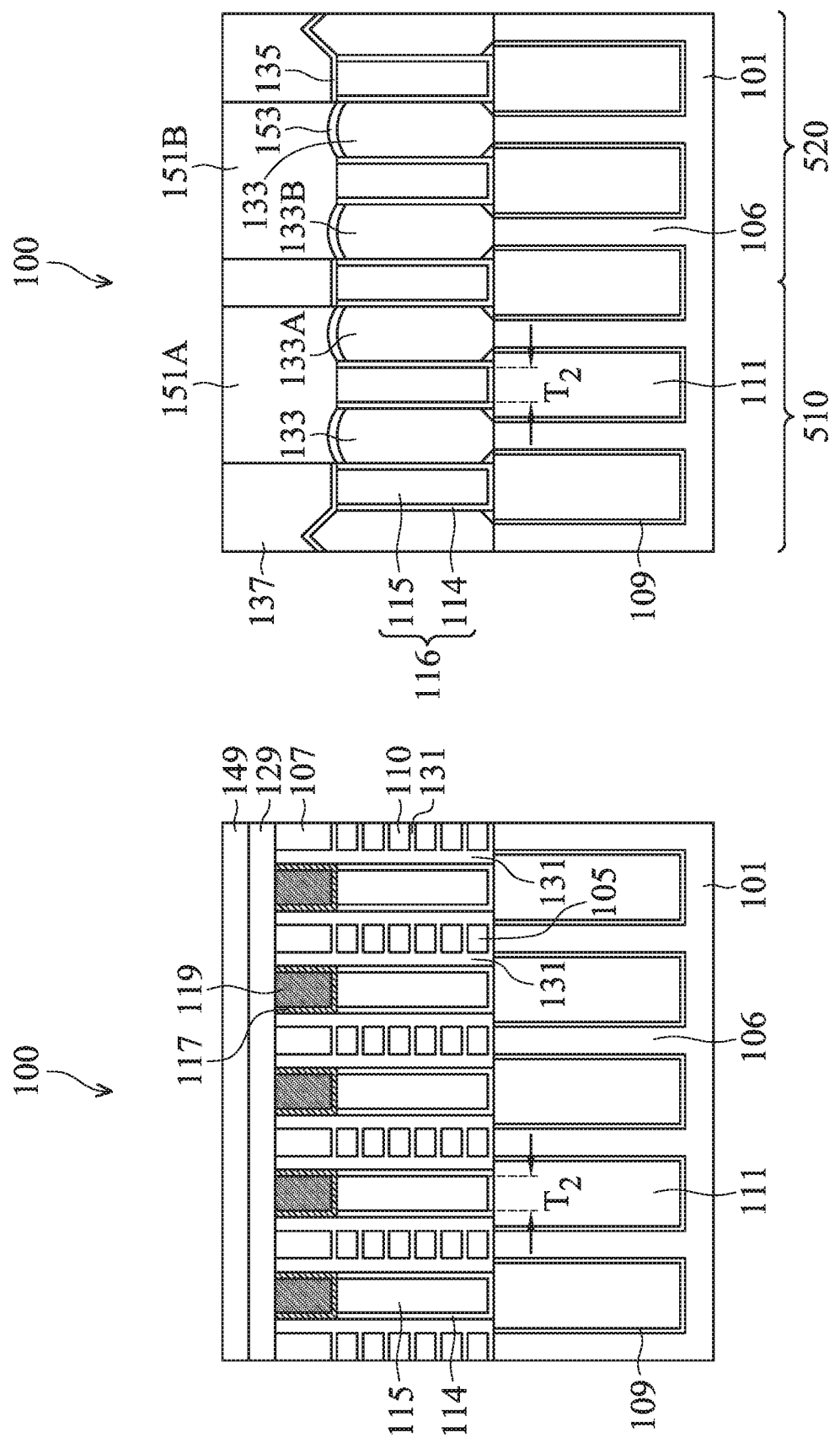

GATE-ALL-AROUND FIELD-EFFECT TRANSISTOR DEVICE

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography and etching techniques to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-26 are various views of a gate-all-around (GAA) field-effect transistor (FET) device at various stages of manufacturing, in accordance with an embodiment.

DETAILED DESCRIPTION

Figure 1:
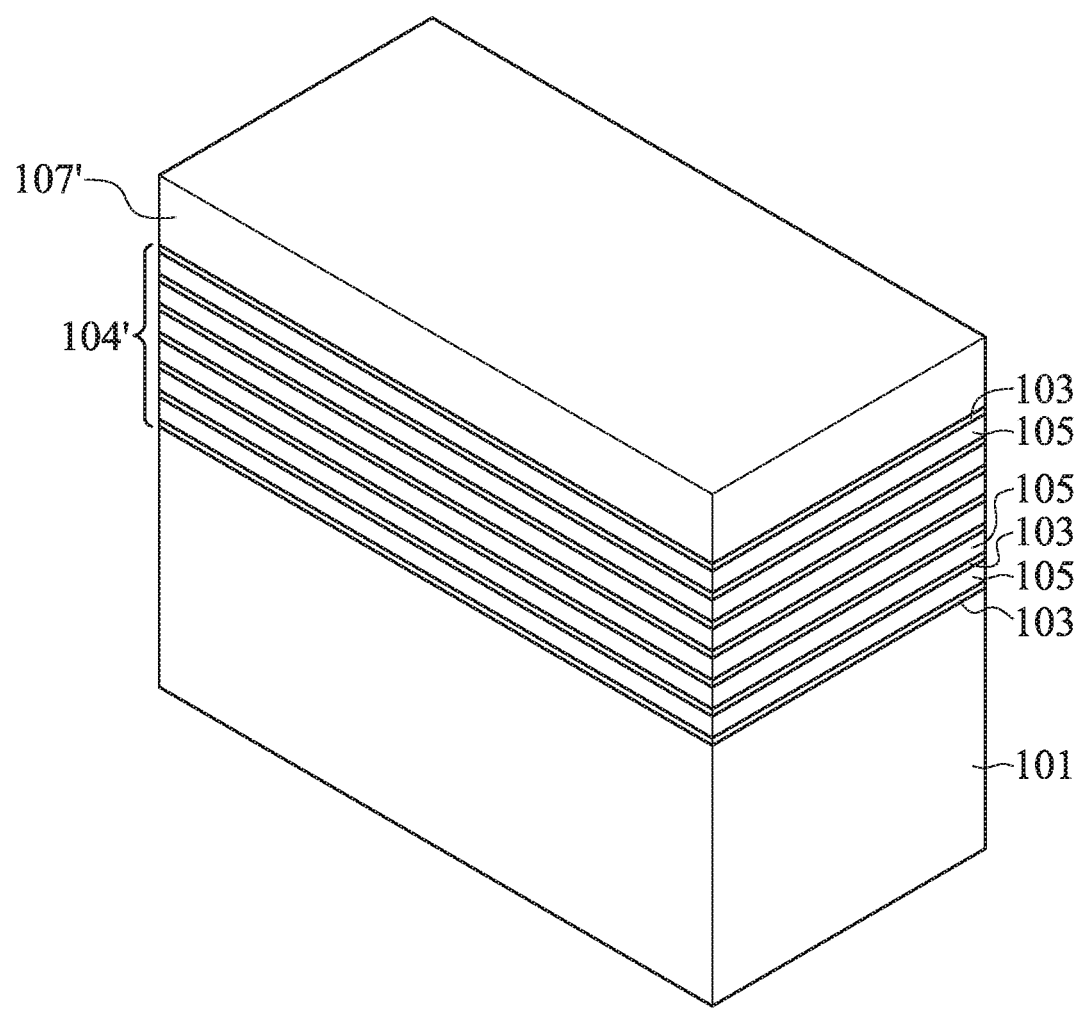

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. Unless other specified, the same or similar reference numerals in different figures refer to the same or similar component formed by a same or similar process(es) using a same or similar material(s).

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a gate-all-around (GAA) field-effect transistor (FET) device includes a semiconductor strip protruding above a substrate, and a first isolation region and a second isolation region on opposing sides of the semiconductor strip. The GAA FET device also includes nanowires over and aligned with the semiconductor strip, and source/drain regions at opposing ends of the nanowires. The GAA FET device further includes a first dielectric fin on the first isolation region, and a metal gate around the nanowires and around center portions of the first dielectric fin, where end portions of the first dielectric fin are disposed on opposing sides of the metal gate, and the end portions of the first dielectric fin are wider than the center portions of the first dielectric fin.

FIGS. 1-26 are various views (e.g., perspective view, cross-sectional view, plan view) of a gate-all-around (GAA) field-effect transistor (FET) device 100 at various stages of manufacturing, in accordance with an embodiment. FIGS. 1-13 and 23 are perspective views of the GAA FET device 100. FIGS. 14-22, 25, and 26 are cross-sectional views of the GAA FET device 100, and FIG. 24 is a top view of the GAA FET device 100. Note that for clarity, some of the FIGS. 1-26 may illustrate only portions of, and therefore, not all, of the GAA FET device 100.

Referring to FIG. 1, a substrate 101 is provided. The substrate 101 may be a semiconductor substrate, such as a bulk semiconductor (e.g., bulk silicon), a semiconductor-on-insulator (SOI) substrate, or the like, which may be doped (e.g., with a P-type or an N-type dopant) or undoped. The substrate 101 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 101 includes silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In FIG. 1, an epitaxial material stack 104' is formed over the substrate 101, and a hard mask layer 107' is formed over the epitaxial material stack 104'. The epitaxial material stack 104' includes alternating first semiconductor layers 103 and second semiconductor layers 105. The first semiconductor layers 103 are formed of a first semiconductor material, and the second semiconductor layers 105 are formed of a different second semiconductor material. In the illustrated embodiment, the first semiconductor material is silicon germanium ($Si_xGe_{1-x}$, where x can be in the range of 0 to 1), and the second semiconductor material is silicon. The epitaxial material stacks 104' may include any number of layers. In subsequent processing, the epitaxial material stacks 104' will be patterned to form channel regions of GAA FETs. In particular, the epitaxial material stacks 104' will be patterned to form horizontal nanowires, with the channel regions of the resulting GAA FETs including multiple horizontal nanowires.

The epitaxial material stacks 104' may be formed by an epitaxial growth process, which may be performed in a growth chamber. During the epitaxial growth process, the growth chamber is cyclically exposed to a first set of precursors for growing the first semiconductor layers 103, and then exposed to a second set of precursors for growing the second semiconductor layers 105. The first set of precursors includes precursors for the first semiconductor material (e.g., silicon germanium), and the second set of precursors includes precursors for the second semiconductor material (e.g., silicon). The epitaxial material stacks 104' may be doped or undoped, depending on the design of the GAA FET device.

In some embodiments, the first set of precursors includes a silicon precursor (e.g., silane) and a germanium precursor (e.g., a germane), and the second set of precursors includes the silicon precursor but omits the germanium precursor. The epitaxial growth process may thus include continuously enabling a flow of the silicon precursor to the growth chamber, and then cyclically: (1) enabling a flow of the germanium precursor to the growth chamber when growing a first semiconductor layer 103; and (2) disabling the flow of the germanium precursor to the growth chamber when growing a second semiconductor layer 105. The cyclical exposure may be repeated until a target number of layers are formed. After the growth cycles are finished, a planarization process may be performed to level the top surface of the epitaxial material stacks 104'. The planarization process may be a chemical mechanical polish (CMP), an etch back process, combinations thereof, or the like.

Next, the hard mask layer 107' is formed over the epitaxial material stacks 104'. The hard mask layer 107' may include sublayers, such as a pad oxide layer and an overlying pad nitride layer. The pad oxide layer may be a thin film comprising silicon oxide formed, for example, using a thermal oxidation process. The pad oxide layer may act as an adhesion layer between the epitaxial material stacks 104' and the overlying pad nitride layer. In some embodiments, the pad nitride layer is formed of silicon nitride, silicon oxynitride, silicon carbonitride, the like, or a combination thereof, and may be formed using low-pressure chemical vapor deposition (LPCVD) or plasma enhanced chemical vapor deposition (PECVD), as examples.

Figure 2:
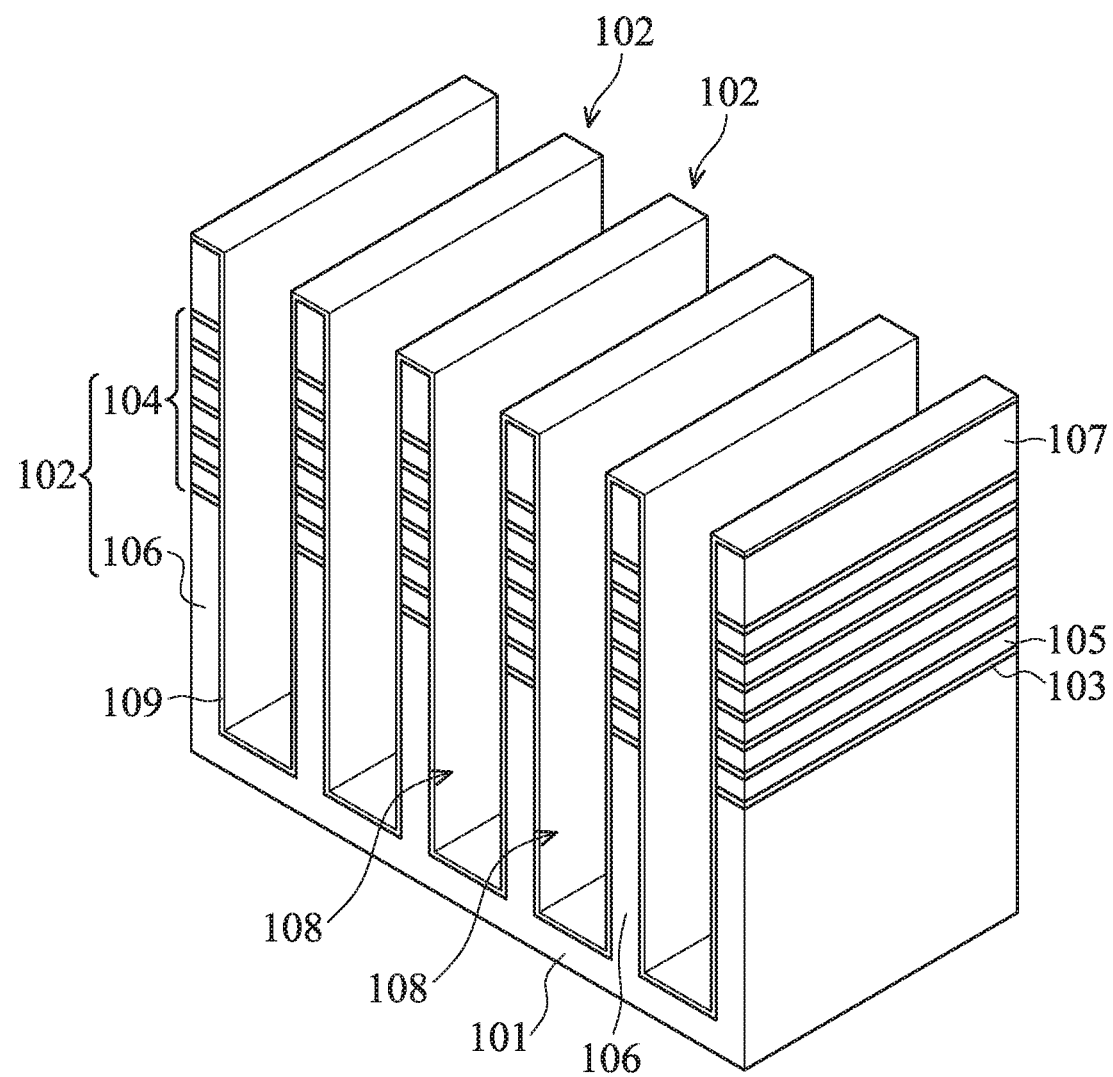

Referring next to FIG. 2, the structure illustrated in FIG. 1 is patterned using, e.g., photolithography and etching techniques. The hard mask layer 107' is patterned to form a patterned hard mask 107, and the patterned hard mask 107 is then used as an etching mask to pattern the substrate 101 and the epitaxial material stacks 104'. Thereafter, a liner 109 is formed over the semiconductor fins 102 and the patterned hard mask 107. Details are discussed hereinafter.

To form the semiconductor fins 102, the hard mask layer 107' may be patterned using photolithography techniques. Generally, photolithography techniques utilize a photoresist material that is deposited, irradiated (exposed), and developed to remove a portion of the photoresist material. The remaining photoresist material protects the underlying material, such as the hard mask layer 107' in this example, from subsequent processing steps, such as etching. In this example, the photoresist material is used to pattern the hard mask layer 107' to form the patterned hard mask 107, as illustrated in FIG. 2.

The patterned hard mask 107 is subsequently used to pattern the substrate 101 and the epitaxial material stack 104' to form trenches 108, thereby defining semiconductor fins 102 between adjacent trenches 108, as illustrated in FIG. 2. In the illustrated embodiment, each of the semiconductor fins 102 includes a semiconductor strip 106 and a patterned epitaxial material stack 104 over the semiconductor strip 106. The semiconductor strip 106 is a patterned portion of the substrate 101 and protrudes above the (recessed) substrate 101. The patterned epitaxial material stack 104 is a patterned portion of the epitaxial material stack 104' and will be used to form nanowires in subsequent processing, and therefore, may also be referred to as nanowire structures 104 or GAA structures 104.

In some embodiments, the semiconductor fins 102 are formed by etching trenches in the substrate 101 and in the epitaxial material stack 104' using, for example, reactive ion etch (RIE), neutral beam etch (NBE), the like, or a combination thereof. The etching process may be anisotropic. In some embodiments, the trenches 108 may be strips (viewed from in the top) parallel to each other, and closely spaced with respect to each other. In some embodiments, the trenches 108 may be continuous and surround the semiconductor fins 102. The semiconductor fins 102 may also be referred to as fins 102 hereinafter.

The fins 102 may be patterned by any suitable method. For example, the fins 102 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

After the fins 102 are formed, the liner 109 is formed along sidewalls and bottoms of the trenches 108. The liner 109 may also be formed over the upper surfaces of the patterned hard mask 107. In an example embodiment, the liner 109 is a silicon liner formed by, e.g., CVD, atomic layer deposition (ALD), combinations thereof, or the like.

Figure 3:
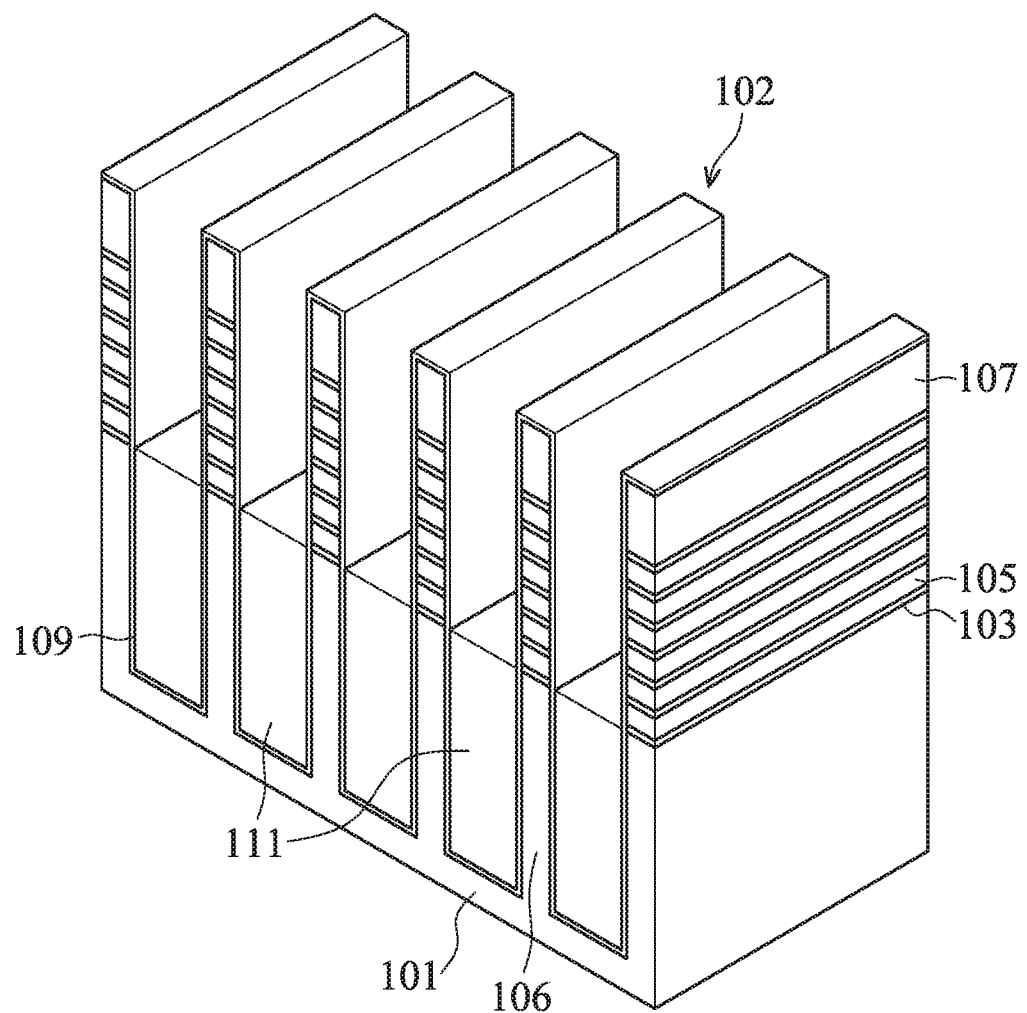

FIG. 3 illustrates the formation of an insulation material between neighboring semiconductor fins 102 to form isolation regions 111. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials and/or other formation processes may be used. In the illustrated embodiment, the insulation material is silicon oxide formed by a FCVD process. An anneal process may be performed once the insulation material is formed. A planarization process, such as CMP, may remove any excess insulation material from over the top surfaces of the semiconductor fins 102.

Next, the isolation regions are recessed to form shallow trench isolation (STI) regions 111. The isolation regions 111 are recessed such that the upper portions of the semiconductor fins 102 protrude from between neighboring STI regions 111. The top surfaces of the STI regions 111 may have a flat surface (as illustrated), a convex surface, a concave surface (such as dishing), or a combination thereof. The top surfaces of the STI regions 111 may be formed flat, convex, and/or concave by an appropriate etch. The isolation regions 111 may be recessed using an acceptable etching process, such as one that is selective to the material of the isolation regions 111. For example, a dry etch, or a wet etch using dilute hydrofluoric (dHF) acid, may be performed to recess the isolation regions 111. In FIG. 3, the upper surface of the STI regions 111 is illustrated to be level with upper surfaces of the semiconductor strips 106. In other embodiments, the upper surface of the STI regions 111 is lower (e.g., closer to the substrate 101) than the upper surfaces of the semiconductor strips 106.

Figure 4:
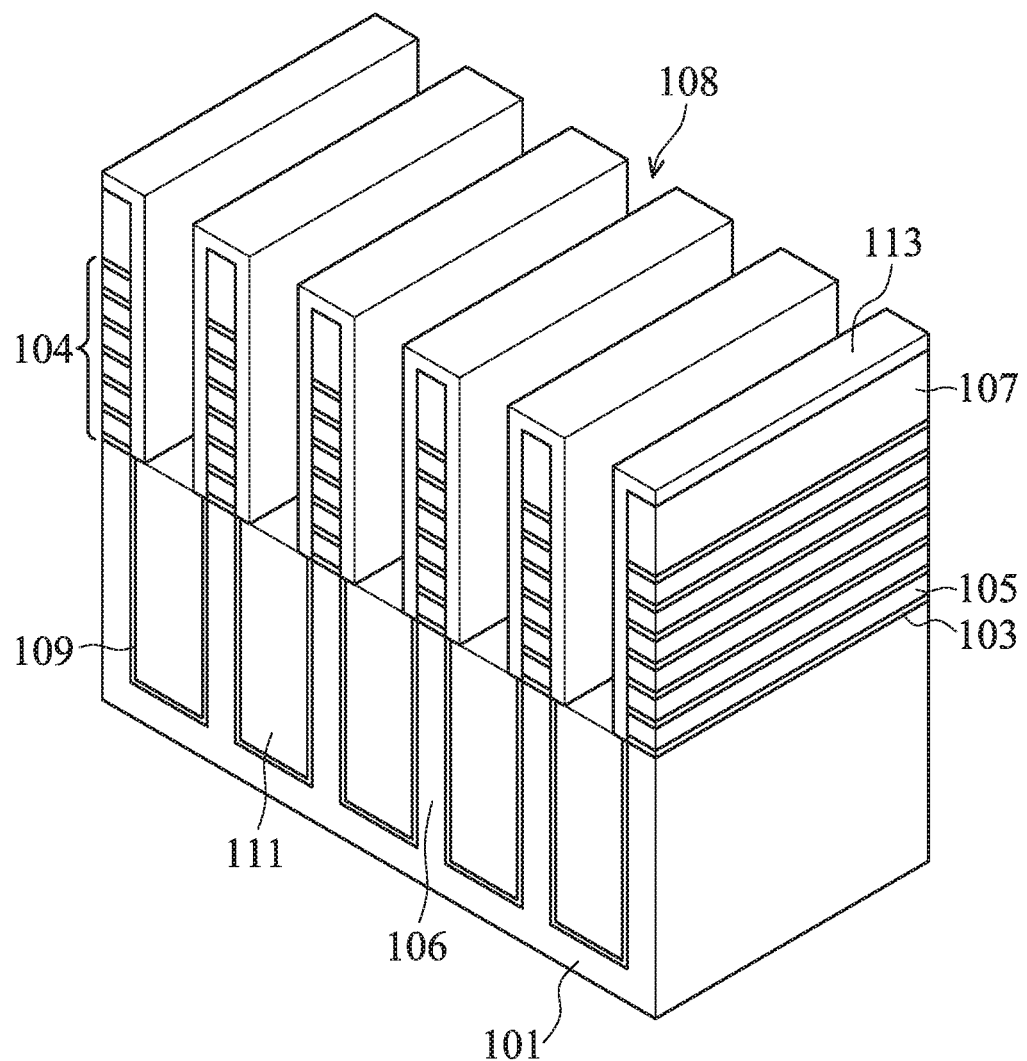

Next, in FIG. 4, a capping layer 113 is conformally formed over the GAA structure 104 and over the patterned hard mask 107. The capping layer 113 is an epitaxial semiconductor layer formed using, e.g., a CVD process, in some embodiments. In an example embodiment, the capping layer 113 and the first semiconductor layer 103 are formed of a same epitaxial material, such as silicon germanium. The capping player 113 is selectively grown on exposed surfaces of the liner 109 (e.g., a silicon liner, see FIG. 3) using an epitaxial growth process, and therefore, the upper surface of the STI region 111 is free of the capping layer 113, in some embodiments. The capping layer 113 may have a thickness of about 5 nm, as an example. To avoid clutter, portions of the liner 109 disposed above the upper surface of the STI regions 111 are not illustrated in FIG. 4 and subsequent figures, with the understanding that the liner 109 may exist between the capping layer 113 and the GAA structure 104/patterned hard mask 107.

Figure 5:
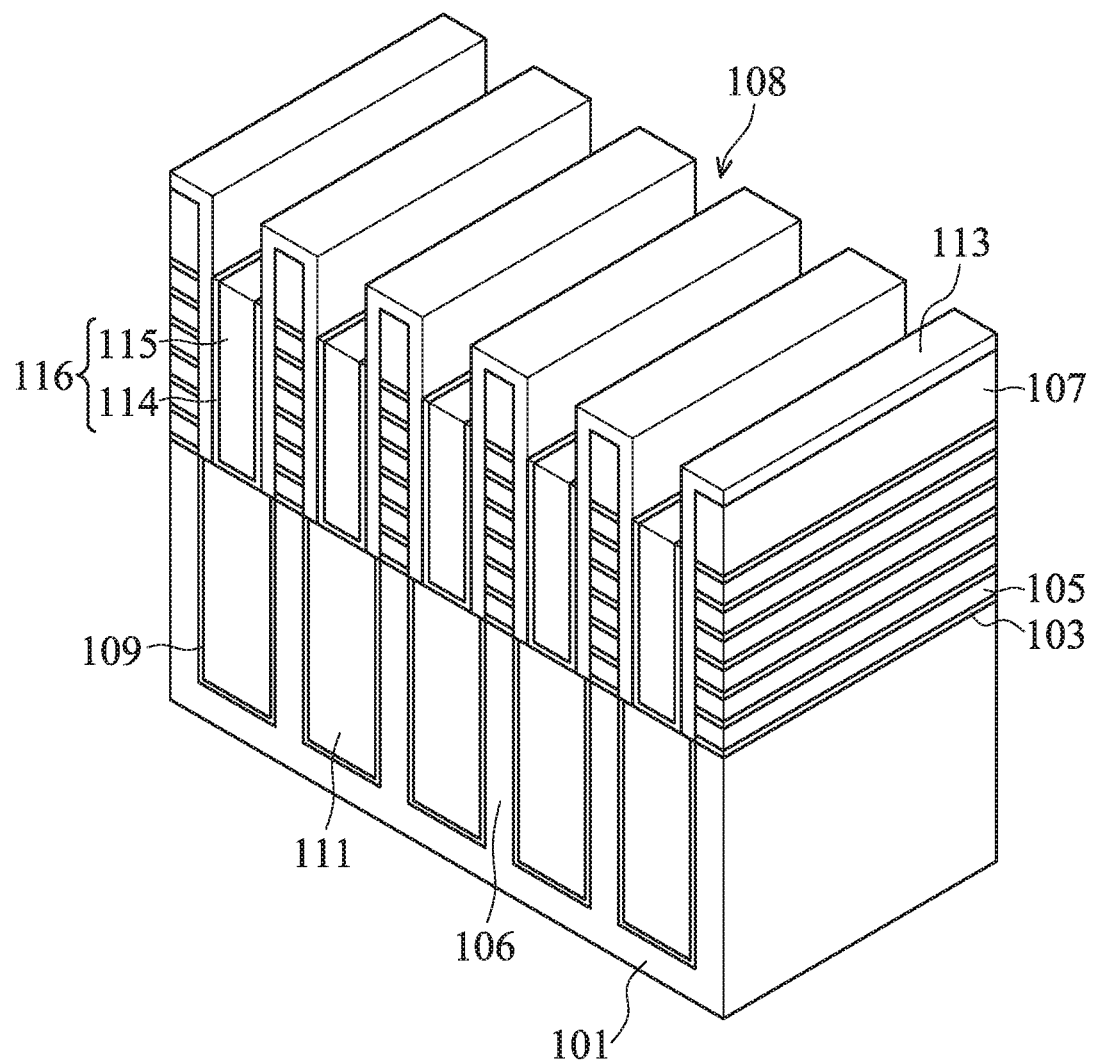

Next, in FIG. 5, a dielectric layer 114 is conformally formed over the capping layer 113 and over the upper surface of the STI regions 111. Next, a dielectric layer 115 is formed over the dielectric layer 114 to fill the trenches 108. The dielectric layer 114 and the dielectric layer 115 are then etched back to form dielectric fins 116, details of which are discussed hereinafter.

In some embodiments, the dielectric layer 114 is formed by forming a conformal layer of silicon nitride along the capping layer 113 and along the upper surface of the STI regions 111 using a suitable deposition method such as CVD. The dielectric layer 115 is then formed over the dielectric layer 114. In the illustrated embodiment, the dielectric layer 115 is formed using a low-K dielectric material (e.g., having a dielectric constant K smaller than about 7, such as smaller than about 3.9), such as $SiO_2$, SiN, SiCN, or SiOCN.

Next, the dielectric layer 115 (e.g., a low-K dielectric material) is etched back using, e.g., a dry etch process or a wet etch process. For example, a dry etch process using a fluoride-containing gas may be used to etch back the dielectric layer 115. After the dielectric layer 115 is etched back, the dielectric layer 114 exposed by the recessed dielectric layer 115 is removed by a suitable etching process, such as a dry etch process or a wet etch process. For example, a wet etch process using $H_3PO_4$ as etchant may be performed to remove the exposed dielectric layer 114. The remaining portions of the dielectric layer 114 and the remaining portions of the dielectric layer 115 form the dielectric fins 116. In the example of FIG. 5, the upper surface of the remaining portions of the dielectric layer 114 and the upper surface of the remaining portions of the dielectric layer 115 are level with each other. Since both the dielectric layer 114 and the dielectric layer 115 are formed of low-K dielectric materials, the dielectric fins 116 may also be referred to as low-K dielectric fins. As illustrated in FIG. 5, the dielectric fins 116 are formed on the STI regions 111, and physically contact the capping layer 113 disposed on opposing sides of the dielectric fins 116.

Figure 6:
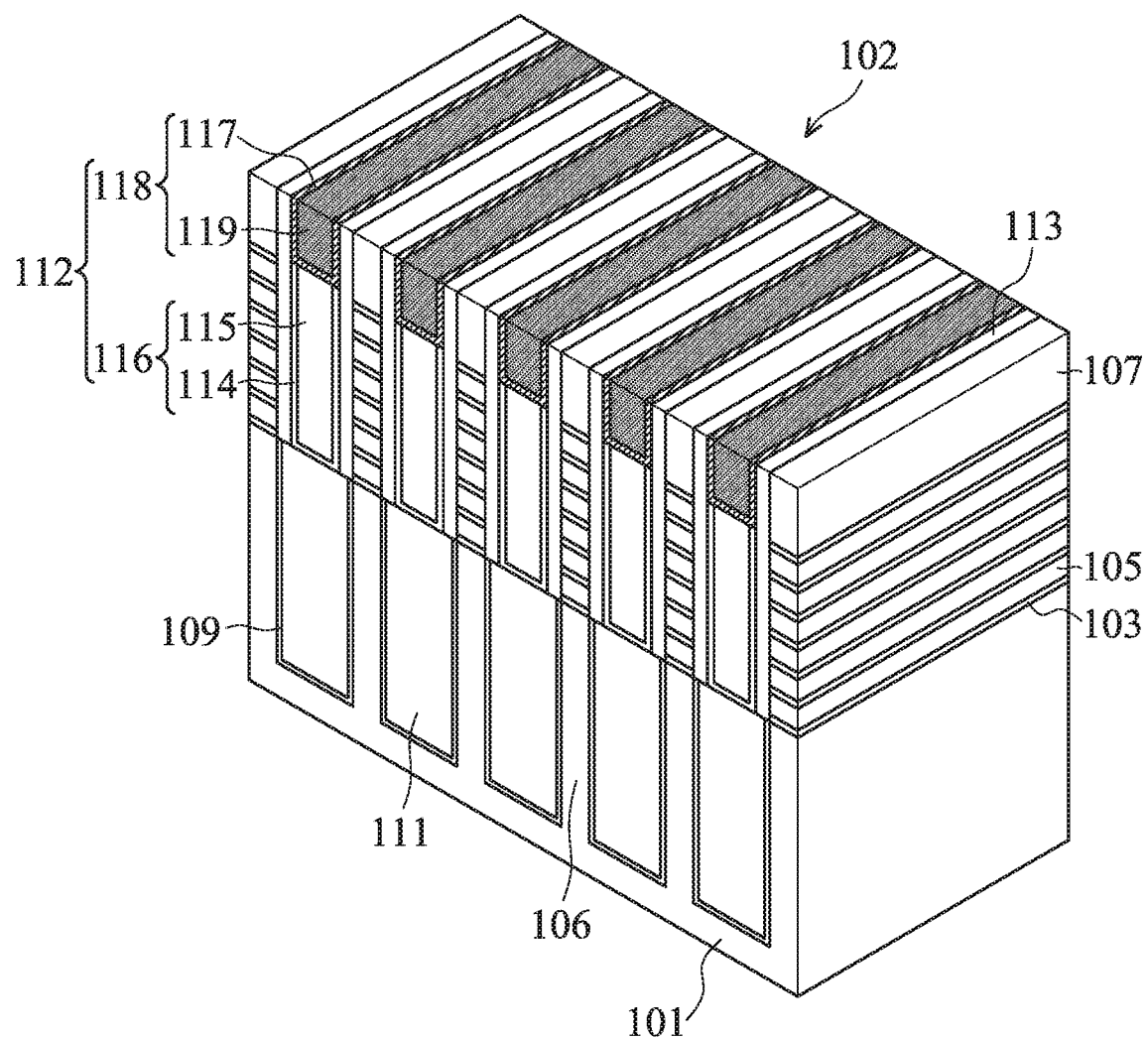

Next, in FIG. 6, dielectric structures 118 are formed to fill remaining portions of the trenches 108. In the example of FIG. 6, the dielectric structures 118 are formed by conformally forming a dielectric layer 117 over the structure of FIG. 5, and thereafter, forming a dielectric layer 119 over the dielectric layer 117. A planarization process, such as CMP, is then performed to remove portions of the capping layer 113, portions of the dielectric layer 117, and portions of the dielectric layer 119 from the upper surface of the patterned hard mask 107.

In some embodiments, the dielectric layer 117 is formed of aluminum oxide (e.g., $AlO_x$) using a suitable deposition method such as CVD, PVD, combinations thereof, or the like. A thickness of the dielectric layer 117 may be, e.g., about 2 nm. The dielectric layer 119 is formed of a high-K dielectric material (e.g., having a dielectric constant K larger than about 7), such as $HfO_2$, $ZrO_2$, $HfAlO_x$, $HfSiO_x$, or $Al_2O_3$, as examples. Since the dielectric layer 117 and the dielectric layer 119 are both formed of high-K dielectric materials, the dielectric structure 118 may also be referred to as a high-K dielectric structure. In addition, since the dielectric fins 116 are formed of low-K dielectric materials, and since the dielectric structures 118 are formed of high-K dielectric materials, each dielectric fins 116 and a respective overlying dielectric structures 118 may be collectively referred to as a hybrid fin 112.

Figure 7:
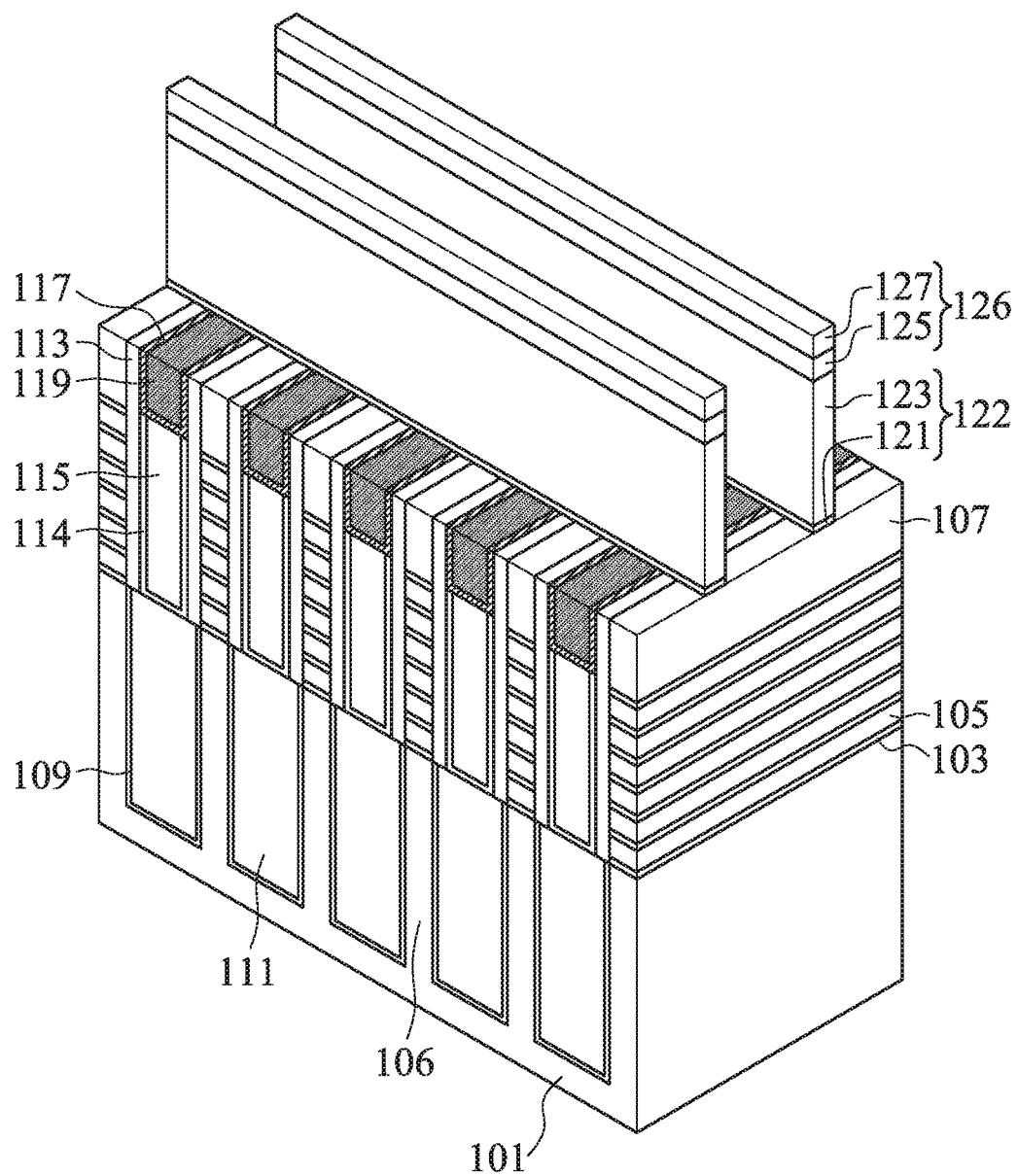

Referring next to FIG. 7, dummy gate structures 122 are formed over the semiconductor fins 102 (see label in FIG. 6) and over the hybrid fins 112. Each of the dummy gate structures 122 includes a gate dielectric 121 and a gate electrode 123, in some embodiments.

To form the dummy gate structure 122, a dielectric layer is formed on the structure illustrated in FIG. 6. The dielectric layer may be, for example, silicon oxide, silicon nitride, multilayers thereof, or the like, and may be deposited or thermally grown. Next, a gate layer is formed over the dielectric layer, and a mask layer is then formed over the gate layer. The gate layer may be deposited over the dielectric layer and then planarized, such as by a CMP process. The mask layer may be deposited over the gate layer. The gate layer may be formed of, for example, polysilicon, although other materials may also be used. The mask layer may be formed of, for example, silicon oxide, silicon nitride, combinations thereof, or the like.

After the layers (e.g., the dielectric layer, the gate layer, and the mask layer) are formed, the mask layer may be patterned using acceptable photolithography and etching techniques to form mask 126. In the example of FIG. 7, the mask 126 includes a first mask 125 (e.g., silicon oxide) and a second mask 127 (e.g., silicon nitride). The pattern of the mask 126 is then transferred to the gate layer and the dielectric layer by an acceptable etching technique to form the gate electrode 123 and the gate dielectric 121, respectively. The gate electrode 123 and the gate dielectric 121 are over (e.g., directly over) the respective channel regions of the GAA FET device to be formed. The gate electrode 123 may also have a lengthwise direction substantially perpendicular to the lengthwise direction of the semiconductor fins 102 or the lengthwise direction of the hybrid fins 112.

Figure 8:
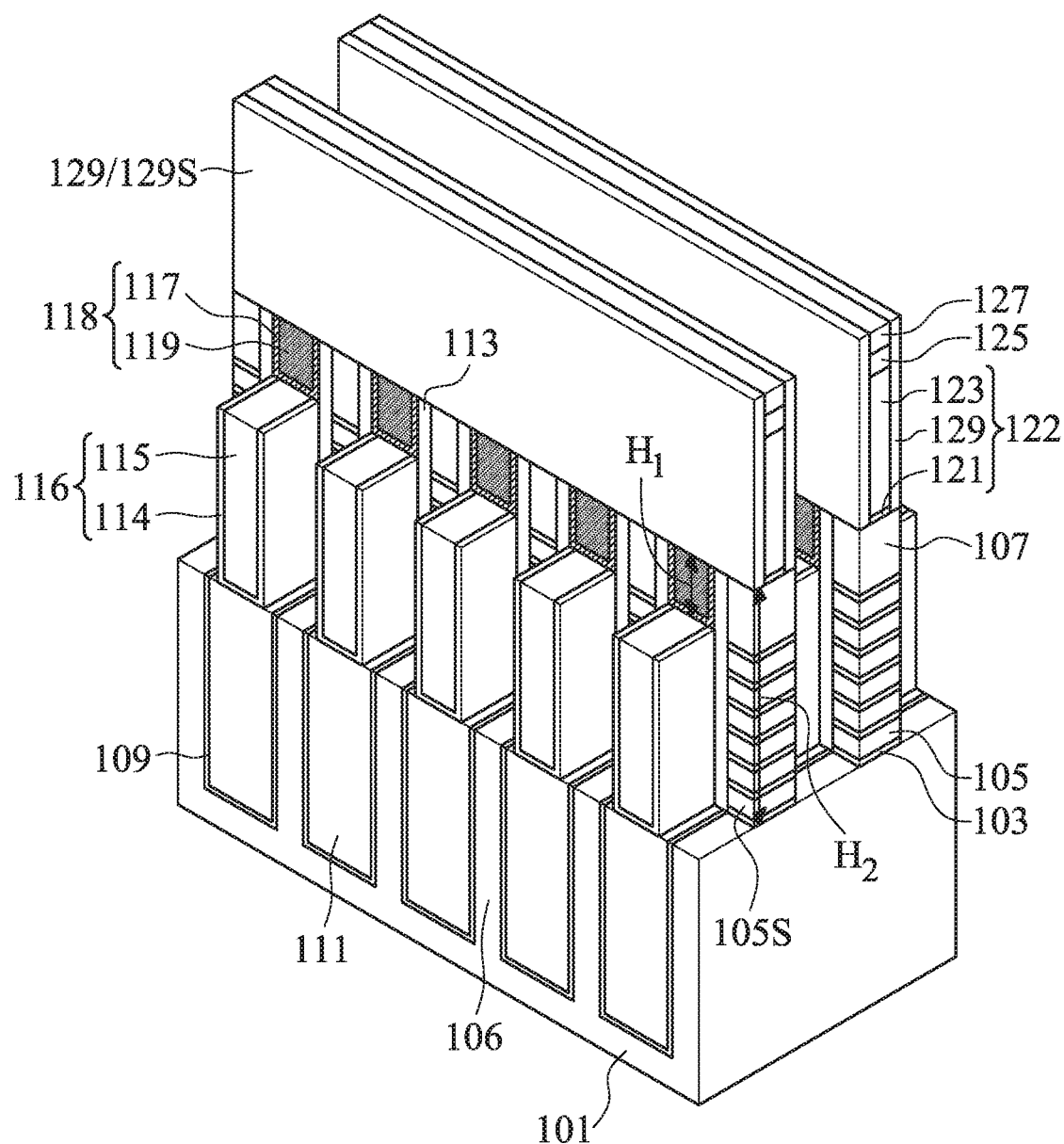

Next, in FIG. 8, gate spacers 129 are formed over sidewalls of the gate electrode 123 and the gate dielectric 121. The gate spacer 129 may be formed by conformally depositing a gate spacer layer over the structure illustrated in FIG. 7. The gate spacer layer may be silicon nitride, silicon carbonitride, a combination thereof, or the like. In some embodiments, the gate spacer layer includes multiple sublayers. For example, a first sublayer (sometimes referred to as a gate seal spacer layer) may be formed by thermal oxidation or a deposition, and a second sublayer (sometimes referred to as a main gate spacer layer) may be conformally deposited on the first sublayer. The gate spacers 129 are formed by anisotropically etching the gate spacer layer. The anisotropic etching may remove horizontal portions of the gate spacer layer (e.g., over the patterned hard mask 107, the hybrid fins 112, and the mask 126), with remaining vertical portions of the gate spacer layer (e.g., along sidewalls of the gate electrode 123 and sidewalls of the gate dielectric 121) forming the gate spacers 129. In the discussion herein, the gate spacers 129 may also be referred to as part of the dummy gate structure 122.

Next, an anisotropic etching process is performed to remove portions of the dielectric structure 118, portions of the GAA structures 104 (e.g., 103 and 105), and portions of the patterned hard mask 107 that are outside the boundaries of the dummy gate structure 122 (e.g., outside the exterior sidewalls of the gate spacers 129). The anisotropic etching process may be performed using the dummy gate structure 122 as an etching mask. After the anisotropic etching, the sidewall 129S of the gate spacer 129 is aligned with a respective sidewall 105S of the second semiconductor layer 105, due to the anisotropic etching, in some embodiments.

In some embodiments, the anisotropic etching process is a dry etch process (e.g., a plasma etch process) using an etchant(s) that is selective to (e.g., having a higher etching rate for) the materials of the patterned hard mask 107 and the GAA structure 104. In an example embodiment, the dry etch process has an average etching rate of $E_1$ for the dielectric structure 118 (e.g., high-K material) and an average etching rate of $E_2$ ($E_2 > E_1$) for the combination of the patterned hard mask 107 (e.g., low-K material) and the GAA structure 104 (e.g., semiconductor material), and the ratio between $E_1$ and $E_2$ may be chosen to be $E_1/E_2 = H_1/H_2$, where $H_1$ is the height of the dielectric structure 118, and $H_2$ is the sum of the height of the patterned hard mask 107 and the height of the GAA structure 104. With the above relationship between the ratios, when the dielectric structure 118 (e.g., outside the boundaries of the dummy gate structure 122) is removed to expose the underlying dielectric fin 116, at the same time, the patterned hard mask 107 and the GAA structure 104 (e.g., outside the boundaries of the dummy gate structure 122) are also removed to expose the underlying semiconductor strips 106.

Figure 9:
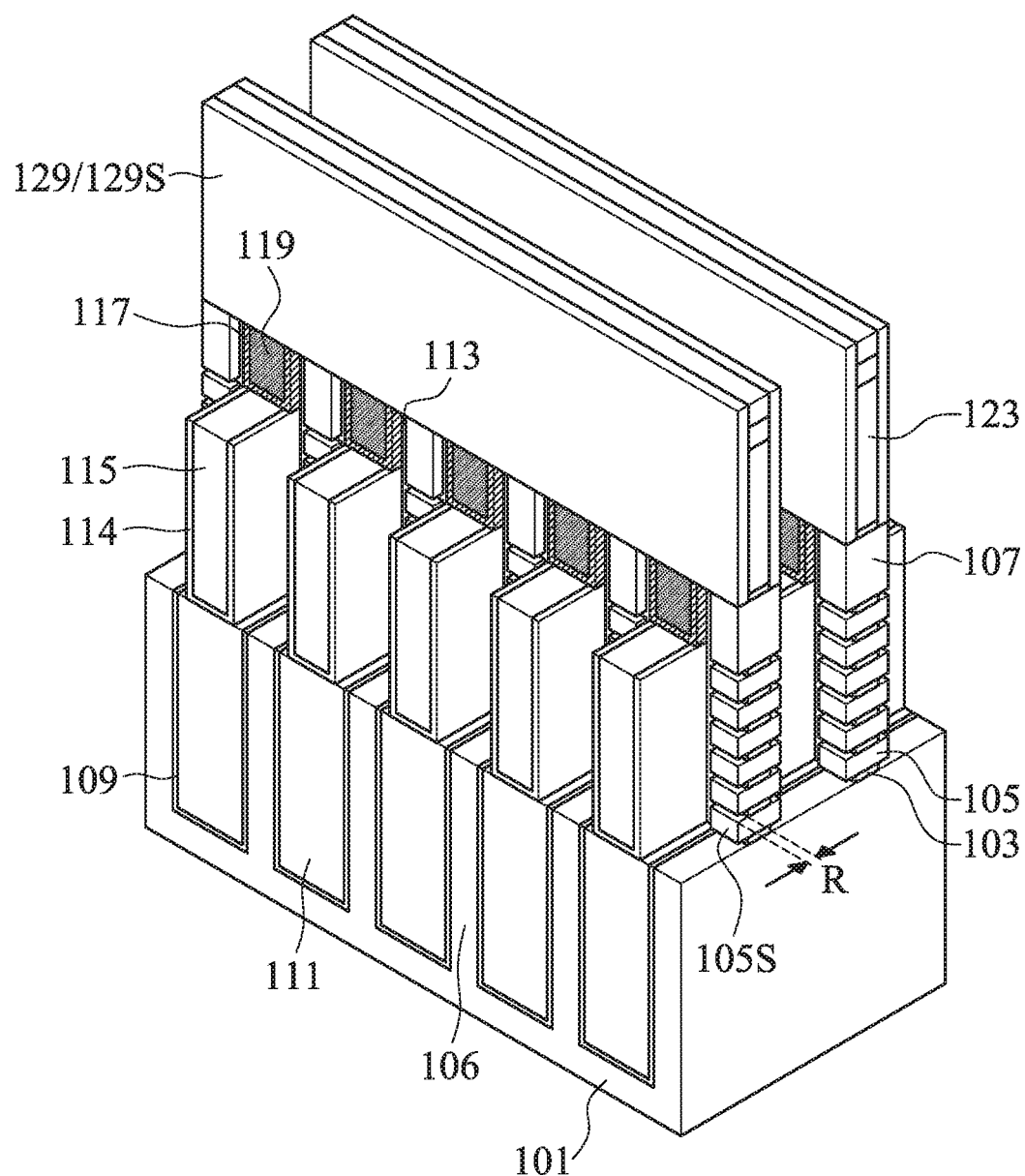

Next, in FIG. 9, a lateral etching process is performed to recess exposed portions of the first semiconductor material using an etchant that is selective to the first semiconductor material. In the example of FIG. 9, both the capping layer 113 and the first semiconductor layer 103 are formed of the first semiconductor material (e.g., SiGe), and therefore, the lateral etch recesses both the capping layer 113 and the first semiconductor layer 103. After the lateral etching process, the first semiconductor material is recessed from the sidewalls 129S of the gate spacers 129, from the sidewalls 105S of the (remaining portions of) second semiconductor layer 105, and from the sidewalls of the (remaining portions of) patterned hard mask 107. For example, FIG. 9 illustrates an offset R between the sidewall 105S of the second semiconductor layer 105 and the sidewall of the recessed first semiconductor layer 103.

Figure 10:
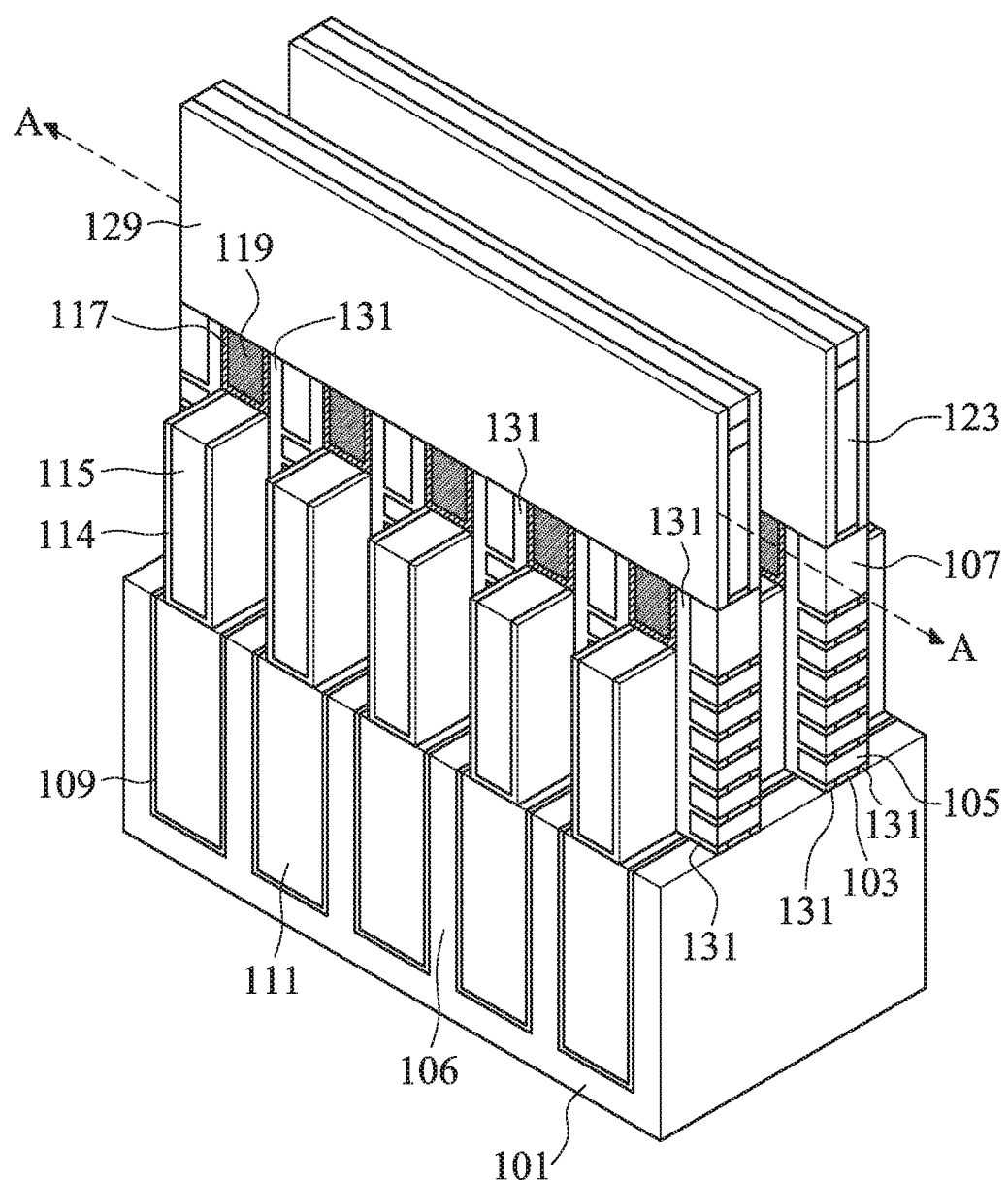

Next, in FIG. 10, a dielectric material 131 is formed to fill the space left by the removal (e.g., recess) of the first semiconductor material discussed above with reference to FIG. 9. The dielectric material 131 may be a low-K dielectric material, such as $SiO_2$, SiN, SiCN, or SiOCN, and may be formed by a suitable deposition method, such as ALD. After the deposition of the dielectric material 131, an anisotropic etching process may be performed to trim the deposited dielectric material 131, such that only portions of the deposited dielectric material 131 that fill the space left by the removal of the first semiconductor material are left. After the trimming process, the remaining portions of the deposited dielectric material 131 form inner spacers 131. The inner spacers 131 serve to isolate metal gates from source/drain regions formed in subsequent processing. In the example of FIG. 9, front sidewalls of the inner spacers 131 are aligned with the sidewall 129S of the gate spacers 129.

Figure 11:
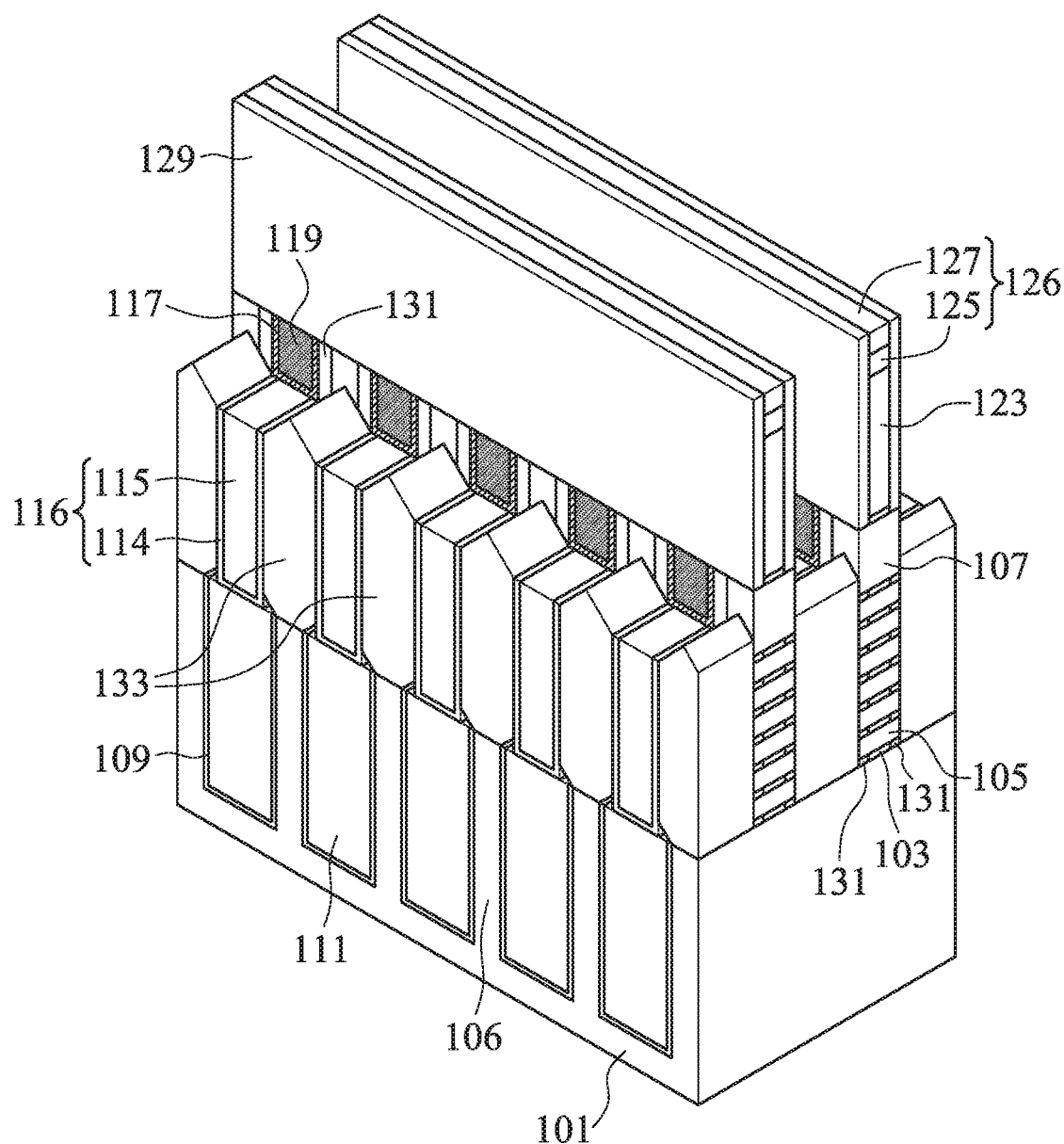

Next, in FIG. 11, source/drain regions 133 are formed over the semiconductor strips 106. The source/drain regions 133 are formed by epitaxially growing a material over the semiconductor strips 106, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof.

As illustrated in FIG. 11, the epitaxial source/drain regions 133 fill the spaces between adjacent dielectric fins 116. The epitaxial source/drain regions 133 may have surfaces raised from surfaces of the dielectric fins 116 and may have facets. The source/drain regions 133 over adjacent semiconductor strips 106 may merge to form a continuous epitaxial source/drain region 133, as illustrated in FIG. 11. In some embodiments, the source/drain regions 133 over adjacent semiconductor strips 106 do not merge together and remain separate source/drain regions 133. The material(s) of the source/drain regions 133 may be tuned in accordance with the type of devices to be formed. In some embodiments, the resulting GAA FET is an n-type FinFET, and source/drain regions 133 comprise silicon carbide (SiC), silicon phosphorous (SiP), phosphorous-doped silicon carbon (SiCP), or the like. In some embodiments, the resulting GAA FET is a p-type FinFET, and source/drain regions 133 comprise SiGe, and a p-type impurity such as boron or indium.

The epitaxial source/drain regions 133 may be implanted with dopants followed by an anneal process. The implanting process may include forming and patterning masks such as a photoresist to cover the regions of the GAA FET device that are to be protected from the implanting process. The source/drain regions 133 may have an impurity (e.g., dopant) concentration in a range from about $1E19$ $cm^{-3}$ to about $1E21$ $cm^{-3}$. P-type impurities, such as boron or indium, may be implanted in the source/drain region 133 of a P-type transistor. N-type impurities, such as phosphorous or arsenide, may be implanted in the source/drain regions 133 of an N-type transistor. In some embodiments, the epitaxial source/drain regions may be in situ doped during growth.

Figure 12:
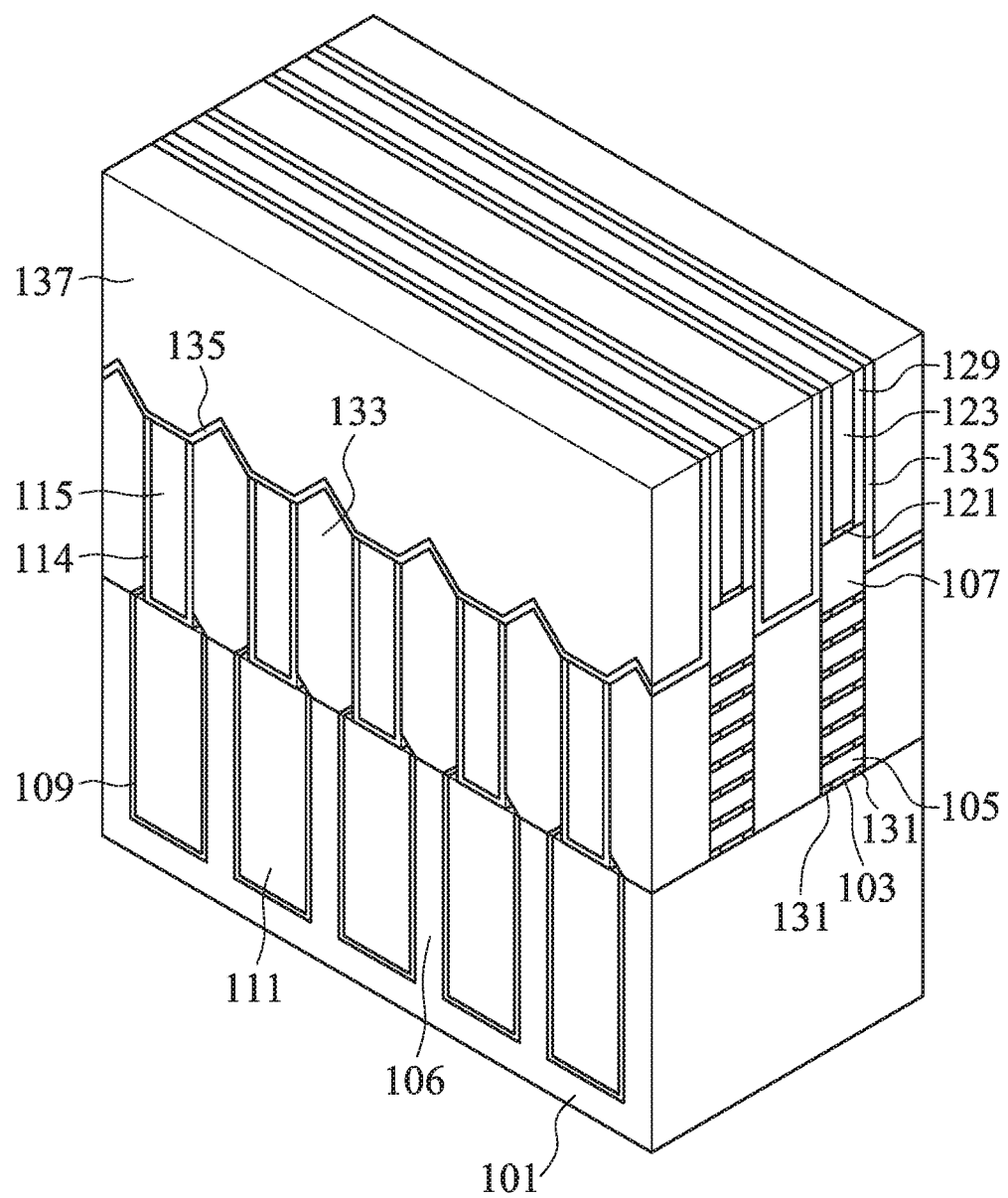

Next, in FIG. 12, a contact etch stop layer (CESL) 135 is formed over the structure illustrated in FIG. 11, and an interlayer dielectric (ILD) layer 137 is formed over the CESL 135. The CESL 135 functions as an etch stop layer in a subsequent etching process, and may comprise a suitable material such as silicon oxide, silicon nitride, silicon oxynitride, combinations thereof, or the like, and may be formed by a suitable formation method such as CVD, PVD, combinations thereof, or the like.

The ILD layer 137 is formed over the CESL 135 and around the dummy gate structures 122. In some embodiments, the ILD layer 137 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. A planarization process, such as a CMP process, may be performed to remove the mask 126 (see FIG. 11) and to remove portions of the CESL 135 disposed over the gate electrode 123. As illustrated in FIG. 12, after the planarization process, the top surface of the ILD layer 137 is level with the top surface of the gate electrode 123.

Figure 13:
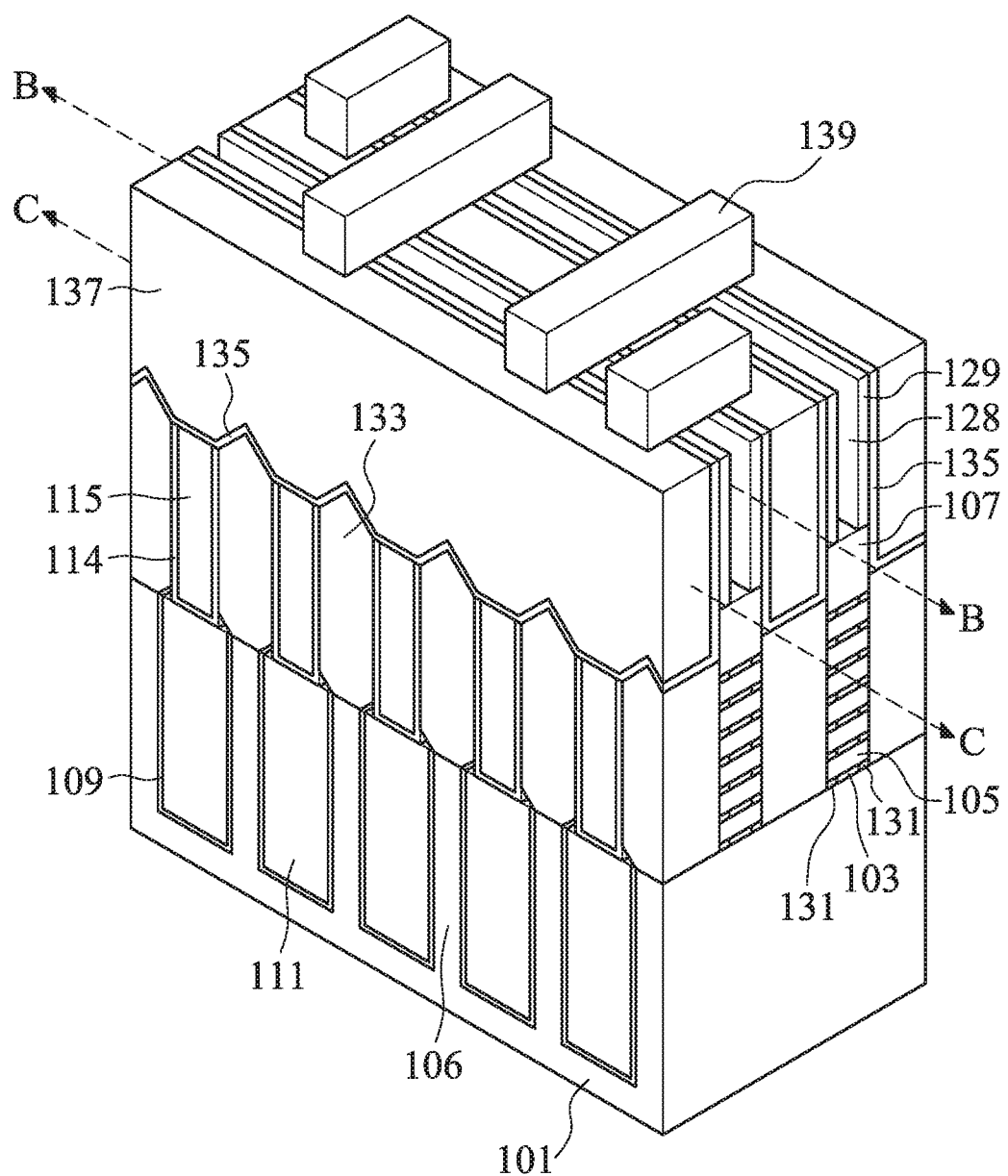

Next, in FIG. 13, the gate electrode 123 (see FIG. 12) and the gate dielectric 121 (see FIG. 12) of the dummy gate structure are removed in an etching step(s), so that recesses 128 are formed between the gate spacers 129. Each recess exposes the remaining portions of the patterned hard mask 107 that are disposed under the dummy gate structure. After the removal of the gate electrode 123 and the gate dielectric 121, cut metal gate (CMG) patterns 139 are formed in the recesses 128. Top surfaces of the CMG patterns 139 may extend above the upper surface of the ILD layer 137. The CMG patterns 139 may be formed by depositing a photoresist layer in the recesses 128, forming a patterned hard mask layer 139A (see FIG. 14) over the photoresist layer, and forming a patterned photoresist 139B by patterning the photoresist layer using the patterned hard mask layer 139A.

Figures 14, 15:
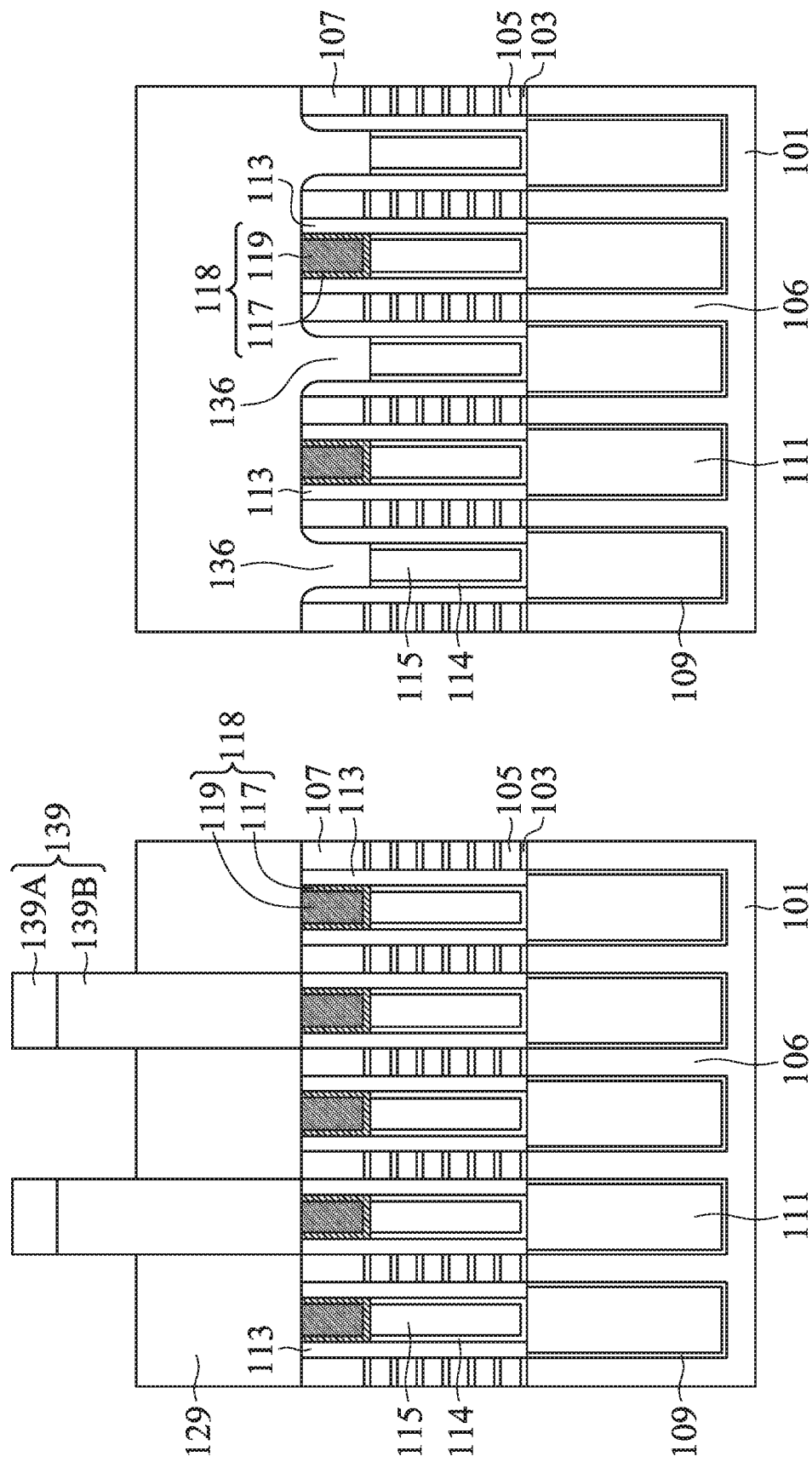

FIGS. 14-22 illustrate cross-sectional views of the GAA FET device 100 at various stages of processing along cross-section B-B in FIG. 13, where the cross-section B-B is between the gate spacers 129 (e.g., in the recess 128) and along a longitudinal direction of the dummy gate structures 122. FIG. 14 illustrates the cross-sectional view of the GAA FET device 100 along the cross-section B-B after the CMG patterns 139 are formed, as descried above with reference to FIG. 13.

Next, in FIG. 15, dielectric structures 118 that are exposed by the CMG patterns 139 are removed, e.g., by an etching process. The etching process may use an etchant that is selective to the materials of the dielectric structures 118. For example, a dry etch process using a chlorine-containing etchant may be performed to remove the exposed dielectric structures 118. After the dielectric structures 118 are removed, the CMG patterns 139 are removed by a suitable method, such as an etching process, an ashing process, combinations thereof, or the like. Recesses 136 are formed at places where the removed dielectric structures 118 used to be.

Figure 16:
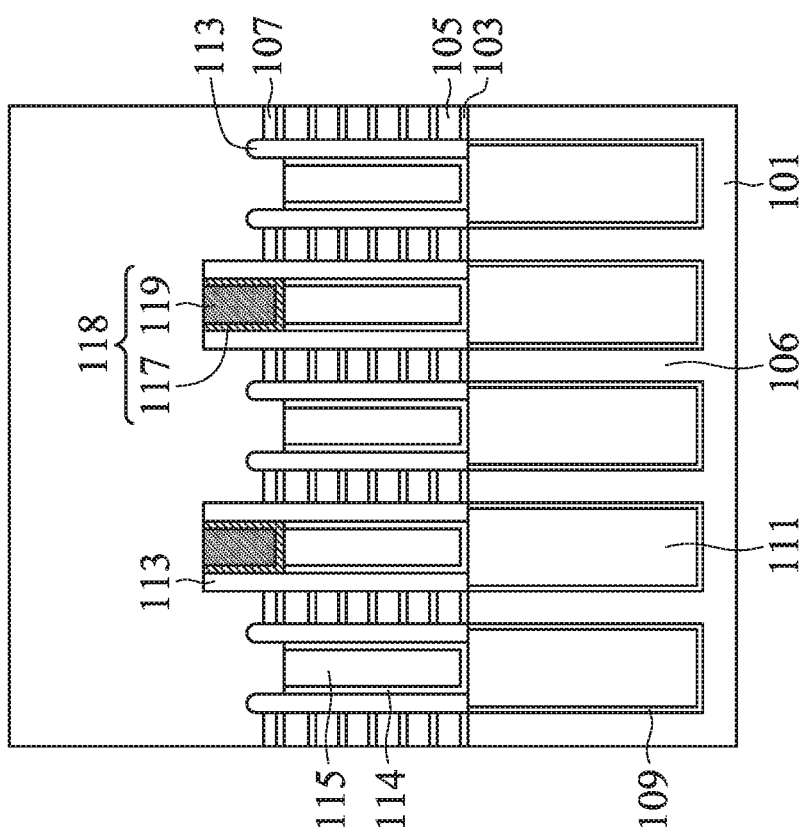

Referring next to FIG. 16, the upper surface of the patterned hard mask 107 is recessed, e.g., by a dry etch process, such that the upper surface of the patterned hard mask 107 is below (e.g., closer to the substrate 101) the upper surface of the dielectric structure 118. The upper surface of the capping layer 113 may also be recessed by the etching process. In the example of FIG. 16, a residue portion of the patterned hard mask 107 remains after the etching process. In subsequent processing, the residue portion of the patterned hard mask 107 may protect the underlying nanowires 110 (see FIGS. 17-19) from being over etched by subsequent etching process(es). In other embodiments, the patterned hard mask 107 is completely removed (see, e.g., FIG. 27) by the etching process.

Figure 17:
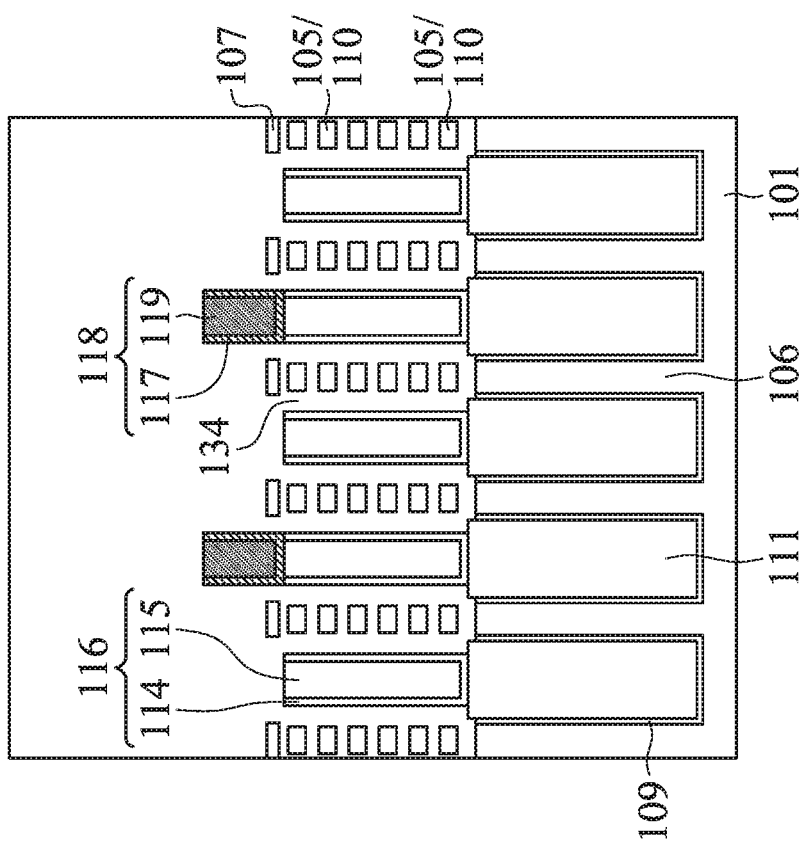

Next, in FIG. 17, the first semiconductor layers 103 and the capping layer 113 are removed to release the second semiconductor layer 105, such that the center portions (e.g., portions between inner spacers 131 and under the recess 128) of the second semiconductor layers 105 are suspended. After the first semiconductor layers 103 and the capping layer 113 are removed, the second semiconductor layer 105 forms a plurality of nanowires 110. In other words, the second semiconductor layer 105 may also be referred to as nanowires 110 in subsequent processing.

Since the first semiconductor layers 103 and the capping layer 113 are both formed of the first semiconductor material (e.g., SiGe), a selective etching process, such as a dry etch or a wet etch that is selective to the first semiconductor material may be performed to form the nanowires 110. The selective etching process to remove the first semiconductor material may also slightly etch the second semiconductor layer 105, which may recess the sidewalls of the second semiconductor layer 105 by, e.g., about 0.5 nm on each side (e.g., left side and right side in FIG. 17), which increases the distance D (see FIG. 18) between the nanowires 110 and the dielectric fins 116, details of which are described hereinafter.

Note that the center portions of the nanowires 110 are suspended, with empty spaces 134 between adjacent nanowires 110 and between the dielectric fins 116 and the nanowires 110. Other portions (may be referred to as end portions) of the nanowires 110, e.g. portions under the gate spacers 129 and portions beyond the boundaries of the gate spacers 129, are not released by the selective etching process described above. Instead, the nanowires 110 are surrounded by the inner spacer 131, as described below with reference to FIG. 25.

Next, in FIG. 18, the dielectric layer 117 (e.g., aluminum oxide) disposed along the sidewalls of the dielectric layer 119 is removed by an etching process. For example, a wet etch process using a mixture of hydrogen peroxide ($H_2O_2$) and ammonia ($NH_3$) may be performed to remove the dielectric layer 117. Portions of the dielectric layer 117 under the dielectric layer 119 remain after the etching process, as illustrated in FIG. 18.

In addition, the dielectric layer 114 (e.g., a silicon nitride layer) disposed along the sidewalls of the dielectric layer 115 is removed by an etching process. For example, a wet etch process using $H_3PO_4$ may be performed to remove the dielectric layer 114. As illustrated in FIG. 18, portions of the dielectric layer 114 under the dielectric layer 115 remain after the etching process.

After the removal of the sidewall portions of the dielectric layer 117 and the sidewall portions of the dielectric layer 114, the thickness $T_1$ of the dielectric fin 116 is reduced (e.g., by about 1 nm on the left side and about 1 nm on the right side in FIG. 18), which results in an increase in the distance D between the dielectric fin 116 and adjacent nanowires 110. The increased distance D facilitates the metal filling process to form the gate electrode 143 (see FIG. 21) in subsequent processing, which illustrates an advantage of the present disclosure. As features sizes continue to shrink in advanced processing nodes, the width of the recess 128 (see FIG. 13) between the gate spacers 129 are getting increasingly small, making it difficult to fill the recess 128 with a conductive material to form the gate electrodes 143. A poorly filled recess 128 may decrease production yield, and/or increase the electrical resistance of the metal gate formed. By increasing the distance D, the current disclosure makes it easier to fill the recess 128, thereby improving the production yield and reduces the electrical resistance of the metal gate formed. In addition, since the increased distance D allows for easy fill of the fill metal, a smaller spacing S (e.g., between about 20 nm and about 40 nm) between adjacent semiconductor strips 106 is made possible by the present disclosure, which advantageously reduces the size (e.g., cell height) of the device formed and increases the integration density of the device.

Next, in FIG. 19, an optional hybrid fin trimming process is performed to further reduce the width of the hybrid fin 112 (e.g., the width $T_1$ of the dielectric fin 116, which may be the same as the width of the dielectric structure 118), and to further increase the distance D. The hybrid fin trimming process may be any suitable etching process, such as a dry etch or a wet etch. In some embodiments, the hybrid fin trimming process is omitted.

Figure 20:
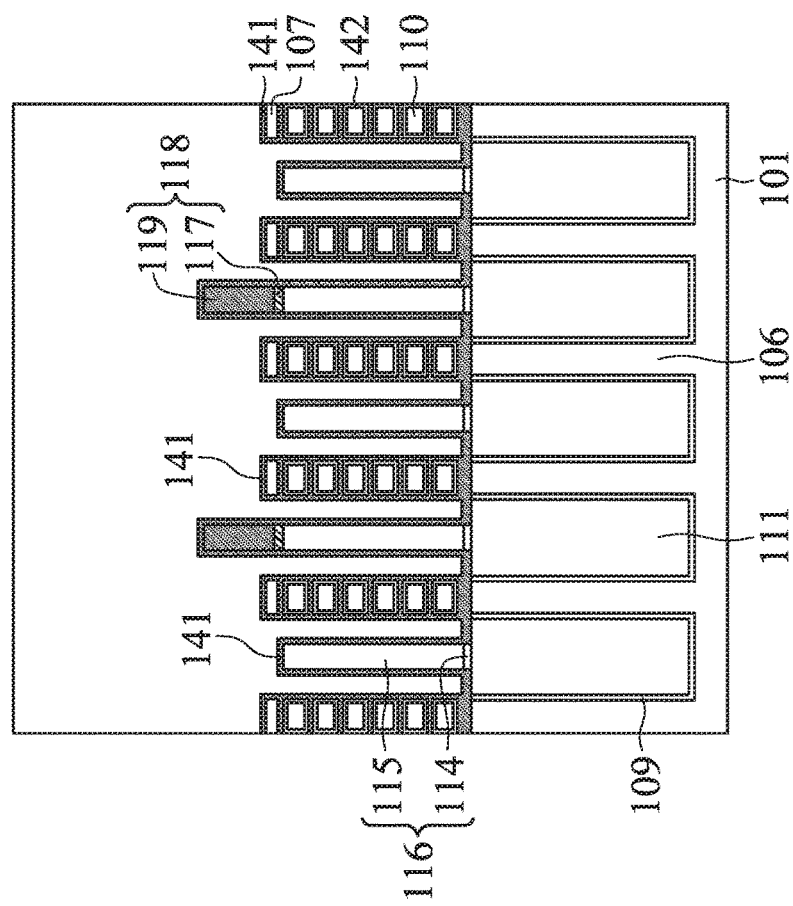

Referring next to FIG. 20, an interface layer 142 is formed over the surfaces of the nanowires 110. The interface layer 142 is a dielectric layer, such as an oxide, and may be formed by a thermal oxidization process or a deposition process. In the illustrated embodiment, a thermal oxidization process is performed to convert exterior portions of the nanowires 110 into an oxide to form the interface layer 142, and as a result, the interface layer 142 is not formed over the dielectric fins 116 or the dielectric structures 118.

After the interface layer 142 is formed, a gate dielectric layer 141 is formed around the nanowires 110, on the dielectric fins 116, on the dielectric structures 118, and on the patterned hard mask 107. The gate dielectric layer 141 is also formed on the upper surface of the STI regions 111, as illustrated in FIG. 20. In some embodiments, the gate dielectric layer 141 includes a high-k dielectric material (e.g., having a K value greater than about 7.0), and may include a metal oxide or a silicate of Hf, Al, Zr, La, Mg, Ba, Ti, Pb, or combinations thereof. For example, the gate dielectric layers 141 may comprise $HfO_2$, $ZrO_2$, $HfAlO_x$, $HfSiO_x$, $Al_2O_3$, or combinations thereof. The formation methods of the gate dielectric layer 141 may include molecular beam deposition (MBD), ALD, PECVD, and the like.

Figure 28:
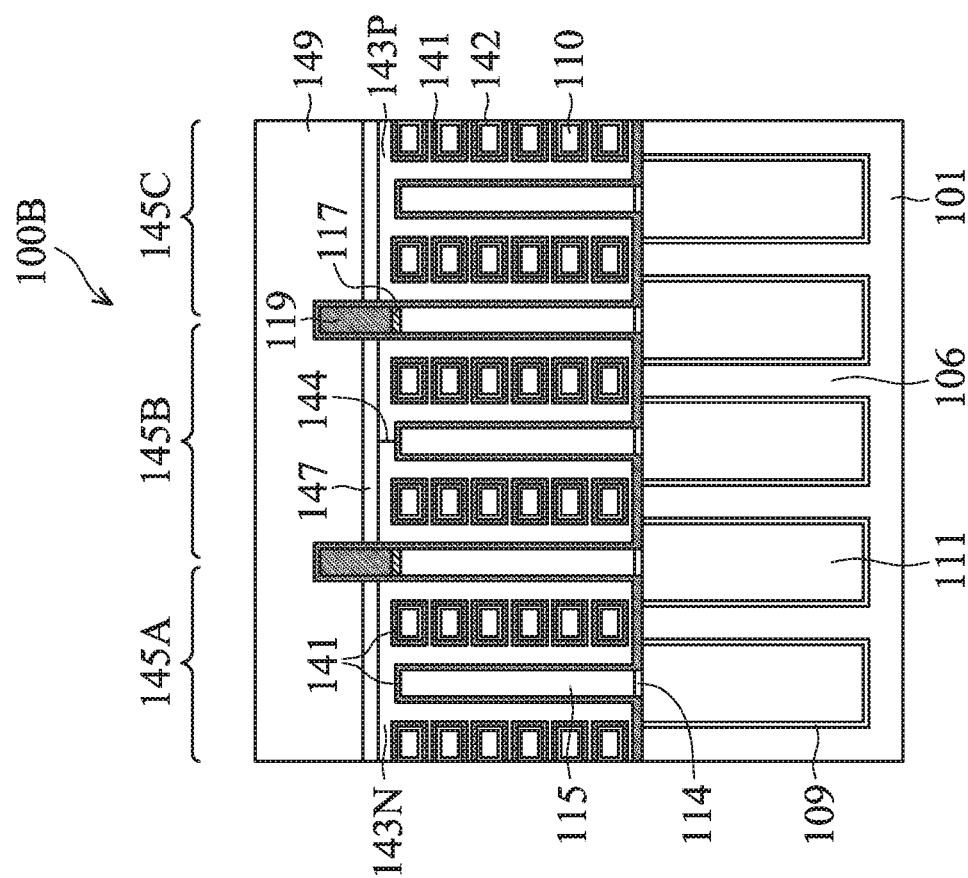
FIG. 28 is a cross-sectional view of a GAA FET device, in accordance with yet another embodiment.

In the example of FIG. 20, portions of the gate dielectric layer 141 formed around the nanowires 110 merge with adjacent gate dielectric layers 141. As a result, the gate dielectric layer 141 completely fills the gaps between vertically adjacent nanowires 110, and fills the gaps between the topmost nanowires 110 and the respective overlying patterned hard mask 107. In addition, the gate dielectric layers 141 completely fills the gaps between the bottommost nanowires 110 and the underlying semiconductor strips 106, as illustrated in FIG. 20. In some embodiments, the merged gate dielectric layers 141 may prevent over-etching of gate electrode 143 (see FIG. 22) in a subsequent etching process. In other embodiments, the portions of the gate dielectric layer 141 around the nanowires 110 do not merge, and therefore, the subsequently formed gate electrode fills the gaps between, e.g., vertically adjacent nanowires 110, as illustrated in the embodiment of FIG. 28.

Figure 21:
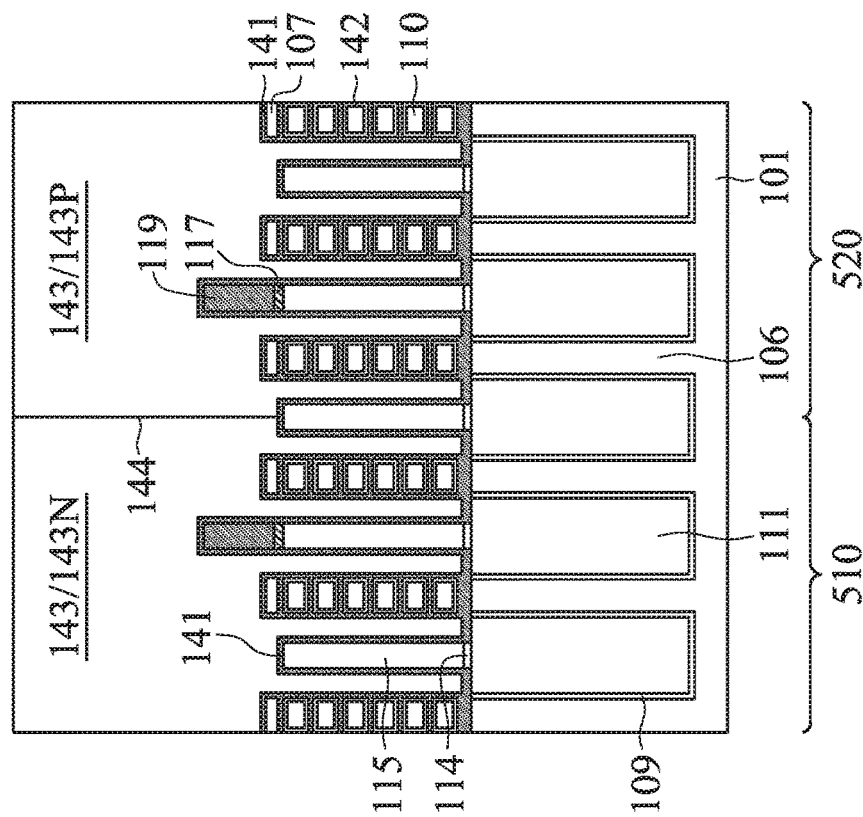

Next, in FIG. 21, an electrical conductive material (may also be referred to as a fill metal) is formed in the recess 128 to form gate electrode 143. The gate electrode 143 may be made of a metal-containing material such as Cu, Al, W, the like, combinations thereof, or multi-layers thereof, and may be formed by, e.g., electroplating, electroless plating, or other suitable method. After the gate electrode 143 is formed, a planarization process such as CMP may be performed to planarize the upper surface of the gate electrode 143.

Although not illustrated, barrier layers and work function layers may be formed over the gate dielectric layer 141 and around the nanowires 110 before the electrical conductive material is formed. The barrier layer may comprise an electrically conductive material such as titanium nitride, although other materials, such as tantalum nitride, titanium, tantalum, or the like, may alternatively be utilized. The barrier layer may be formed using a CVD process, such as PECVD. However, other alternative processes, such as sputtering, metal organic chemical vapor deposition (MOCVD), or ALD, may alternatively be used. After the barrier layer is formed, the work function layer is formed over the barrier layer, in some embodiments.

In the example of FIG. 21, the GAA FET device has an N-type device region 510 and a P-type device region 520. Therefore, an N-type work function layer may be formed over the barrier layer and around the nanowire 110 in the N-type device region 510, and a P-type work function layer may be formed over the barrier layer and around the nanowire 110 in the P-type device region 520. Exemplary P-type work function metals that may be included in the gate structures for P-type devices include TiN, TaN, Ru, Mo, Al, WN, $ZrSi_2$, $MoSi_2$, $TaSi_2$, $NiSi_2$, WN, other suitable P-type work function materials, or combinations thereof. Exemplary N-type work function metals that may be included in the gate structures for N-type devices include Ti, Ag, TaAl, TaAlC, TiAlN, TaC, TaCN, TaSiN, Mn, Zr, other suitable N-type work function materials, or combinations thereof. A work function value is associated with the material composition of the work function layer, and thus, the material of the work function layer is chosen to tune its work function value so that a target threshold voltage Vt is achieved in the device that is to be formed. The work function layer(s) may be deposited by CVD, physical vapor deposition (PVD), and/or other suitable process.

To form the different work function layers in the N-type device region 510 and the P-type device region 520, a patterned mask layer, such as a patterned photoresist, may be formed to cover a first region (e.g., 510) while the work function layer is being formed in the second region (e.g., 520) exposed by the patterned mask layer. Next, the fill metal may be formed over the work function layer in the second region (e.g., 520) to form gate electrode 143P (e.g., portion of the gate electrode 143 that is in the region 520). Similar process may be repeated to cover the second region (e.g., 520) while the work function layer is formed in the first region (e.g., 510), and the fill metal may be formed in the first region over the work function layer to form gate electrode 143N (e.g., portion of the gate electrode 143 that is in the region 510). In the example of FIG. 21, there is an interface 144 between the gate electrodes 143N and 143P, where the barrier layer and the work function layers may extend along the interface 144. For example, an N-type work function layer may extend along the left side of the interface 144, and a P-type work function layer may extend along the right side of the interface 144. In other embodiments, the fill metal may be formed in both the N-type device region 510 and the P-type device region 520 in a single step after the N-type work function layer and the P-type work function layer are formed, in which case the interface 144 may not be formed.

Figure 22:
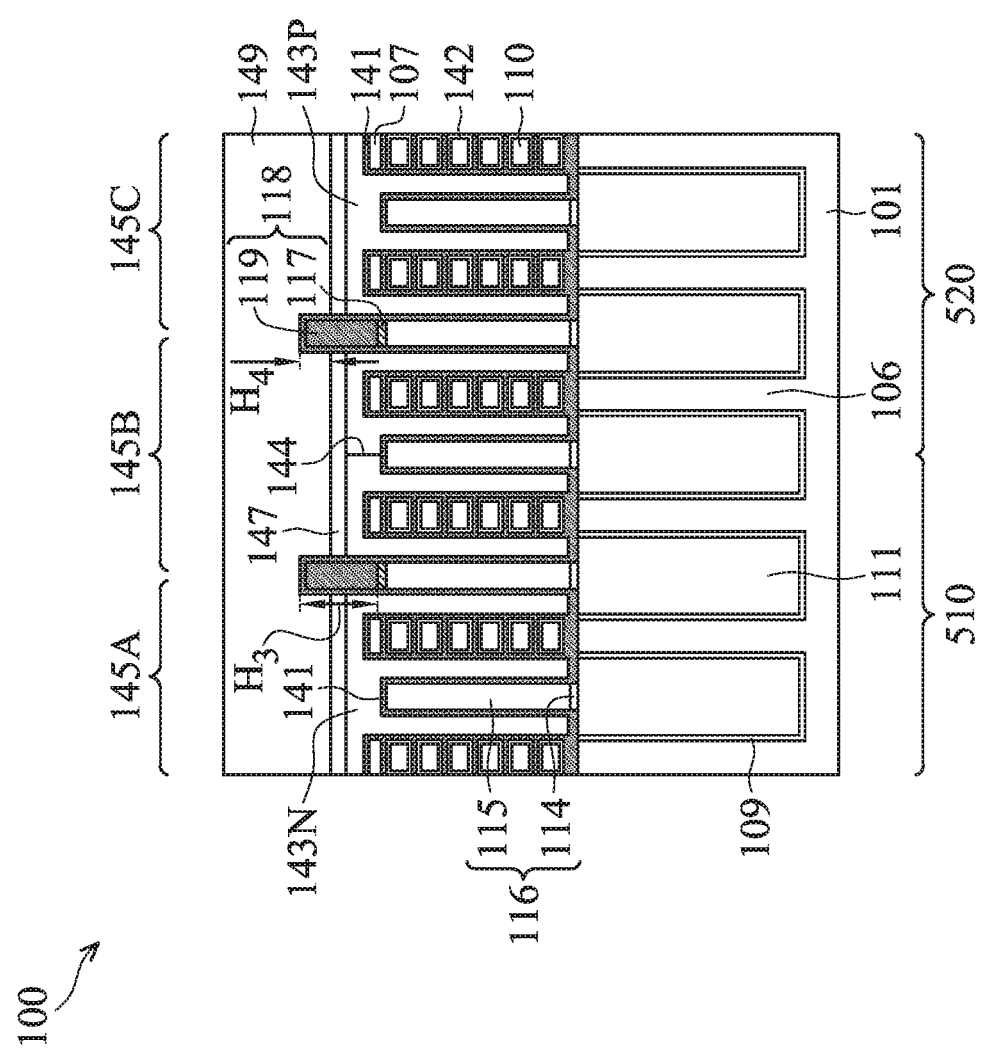

Next, in FIG. 22, the gate electrode 143 is recessed below the upper surface of the dielectric structure 118 (e.g., the upper surface of the dielectric layer 119). An etching process that is selective to the material (e.g., metal) of the gate electrode 143 may be performed to remove top layers of the gate electrode 143 without substantially attacking the dielectric layer 119. In the example of FIG. 22, after the gate electrode 143 is recessed, the dielectric structures 118 separate the gate electrode 143 into three separate portions, and therefore, three separate gate structures 145 (e.g., 145A, 145B, and 145C) are formed in a self-aligned manner, where each of the gate structures 145 includes the gate dielectric layer 141, the barrier layer, at least one work function layer, and the gate electrode 143. In the example of FIG. 22, the gate structure 145A is formed in the N-type device region 510 and has an N-type work function layer. The gate structure 145C is formed in the P-type device region 520 and has a P-type work function layer. The gate structure 145B, however, has its left portion (e.g., left of the interface 144)

in the N-type device region 510 and its right portion (e.g., right of the interface 144) in the P-type device region 520, and therefore, the work function layer of the gate structure 145B includes a left portion formed of an N-type work function layer and includes a right portion formed of a P-type work function layer.

The self-aligned metal gate formation method disclosed herein provides advantages compared with a reference cut metal gate (CMG) process, where the gate electrode 143 is cut into separate metal gates by forming openings in the gate electrode 143 and filling the opening with a dielectric material. For advanced processing nodes, the reference CMG process may have difficulty filling the openings, due to the high aspect ratio of the openings. Poorly filled openings may cause electrical shorts between the gate structures and may cause device failure. The current disclosure allows for easy separation of the metal gates in a self-aligned manner, thus preventing device failure and improving production yield.

After the gate structures 145 are formed, an etch stop layer 147 is formed (e.g., selectively formed) over the gate electrode 143. In some embodiments, the etch stop layer 147 is a fluorine-free tungsten (FFW) layer. The etch stop layer 147 (e.g., tungsten) may act as an etch stop layer in a subsequent etching process, and in addition, may help to reduce the electrical resistance of the gate structures 145 and/or gate contact plugs formed thereafter. After the etch stop layer 147 is formed, a dielectric layer 149 is formed over the etch stop layer 147. In some embodiments, a planarization process is performed to planarize the upper surface of the dielectric layer 149.

In the example of FIG. 22, the height $H_3$ of the dielectric layer 119 of the dielectric structure 118 is between about 10 nm and about 40 nm, and the dielectric layer 119 extends above the upper surface of the etch stop layer 147 by a distance $H_4$, which is larger than about 4 nm. The range of the distance $H_4$ ensures a safety margin large enough to avoid electrical short between adjacent gate structures 145, which electrical short may happen if the upper surface of the dielectric layer 119 is below the upper surface of the gate electrode 143.

Figure 23:
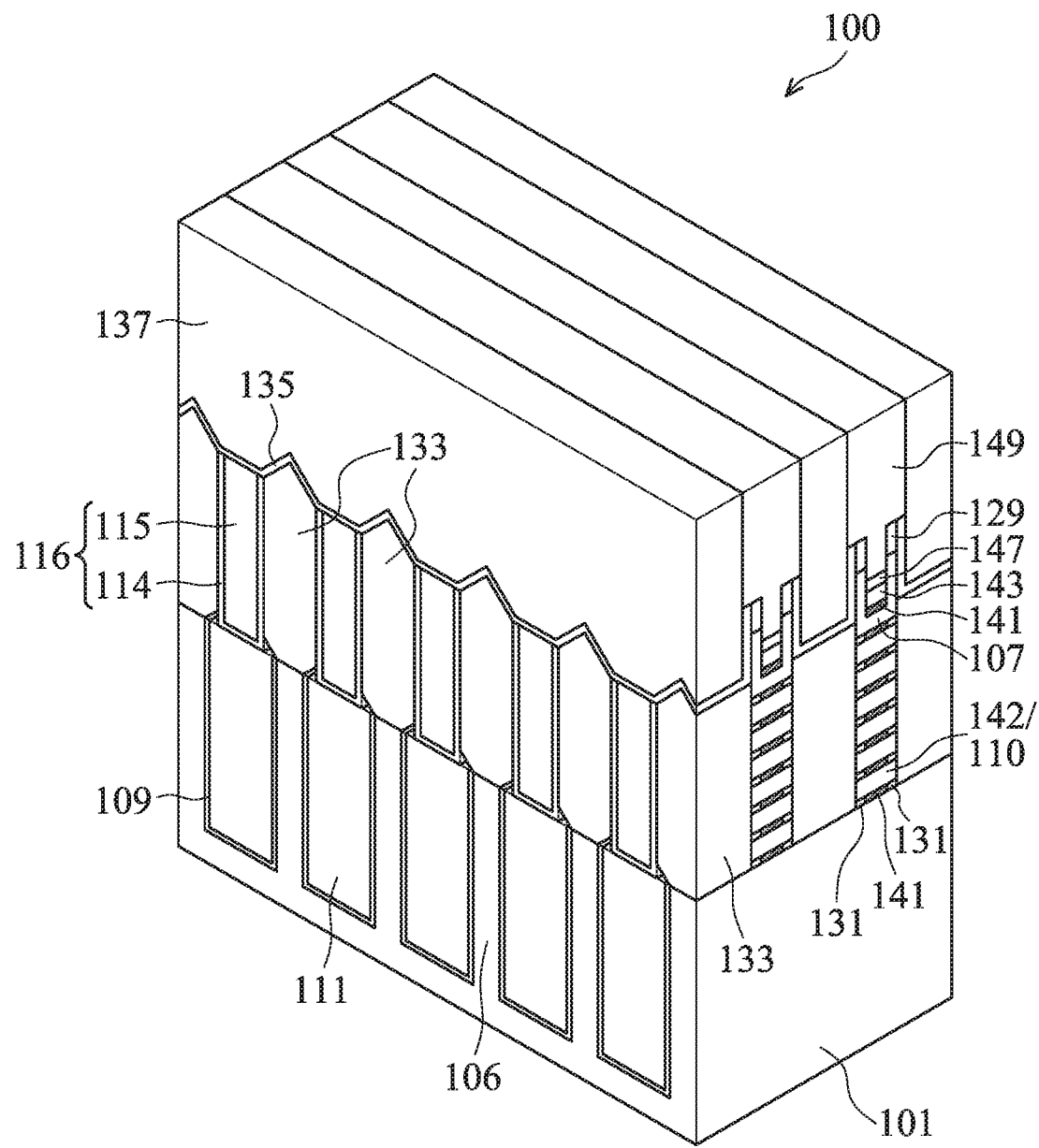
Figure 24:
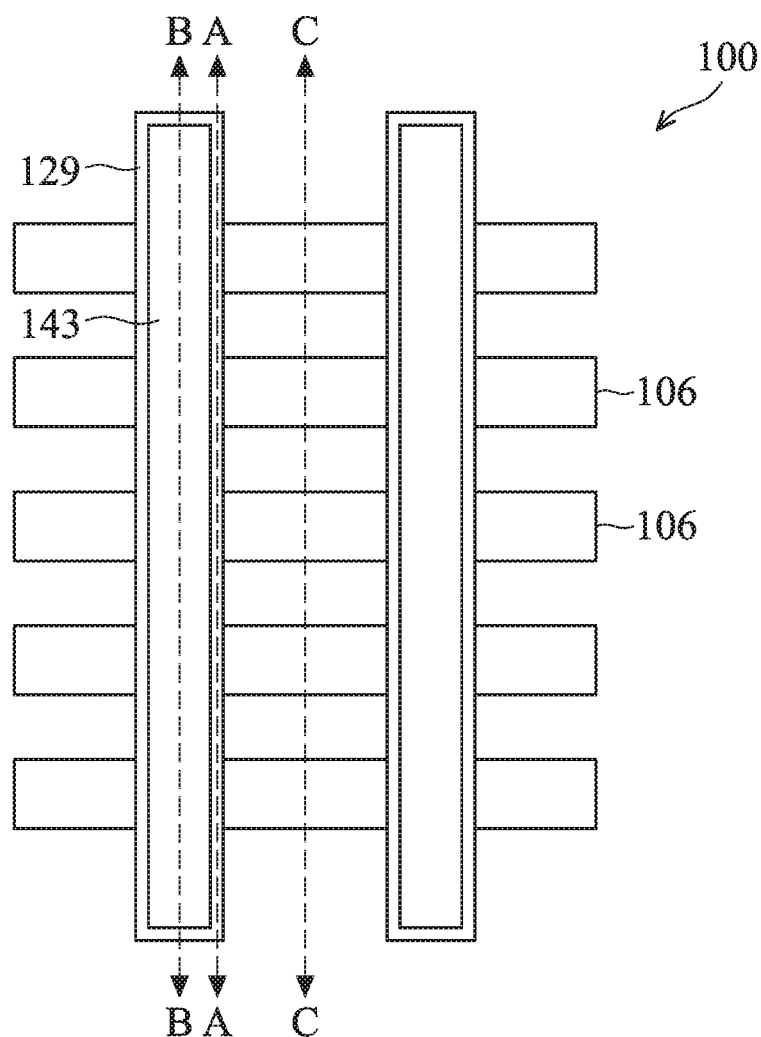

FIG. 23 illustrates a perspective view of the GAA FET device 100 after the processing illustrated in FIG. 22. In FIG. 23, the patterned hard mask 107 has a U-shaped cross-section, which is due to the anisotropic etch to recess the patterned hard mask 107 discussed above with reference to FIG. 16. The anisotropic etch also removes top portions of the gate spacers 129 and results in a reduced height for the gate spacers 129, as shown in FIG. 23. Since the interface layer 142 surrounds the nanowires 110, the locations of the interface layer 142 in FIG. 23 correspond to locations of the nanowires 110 (as indicated by the label 142/110). FIG. 23 further illustrates the inner spacers 131 disposed under the gate spacers 129. Source/drain regions 133 are connected to opposing ends of the nanowires 110, as illustrated in FIG. 23.

FIG. 24 illustrates a plan view of the GAA FET device 100 of FIGS. 22 and 23. For clarity, not all features are illustrated. FIG. 24 illustrates the semiconductor strips 106, the gate electrodes 143, and the gate spacers 129. Cross-section B-B (see also FIG. 13) is along a longitudinal direction of the gate electrode 143 and across the gate electrode 143. Cross-section A-A (see also FIG. 10) is parallel to cross-section B-B, but across the gate spacer 129. Cross-section C-C (see also FIG. 13) is parallel to cross-section B-B, but between two adjacent gate structures and across the source/drain regions 133 (not illustrated in FIG. 24).

FIG. 25 illustrates a cross-sectional view of the GAA FET device 100 of FIGS. 22 and 23, but along cross-section A-A. Note that in the cross-sectional view of FIG. 25, portions of the nanowires 110 disposed under (e.g., directly under) the gate spacers 129 are surrounded by the inner spacer 131. In contrast, referring to FIG. 22, portions of the nanowires 110 under the gate electrode 143 (e.g., between a pair of gate spacers 129) is surrounded by the gate dielectric layer 141 and the interface layer 142. The nanowires 110 are also at least partially surrounded by the gate electrode 143. In addition, in the embodiment of FIG. 28, the nanowires 110 are fully surrounded (e.g., in a full circle) by the gate electrode 143.

FIG. 26 illustrates a cross-section of the GAA FET device 100 along cross-section C-C, after source/drain contacts 151 are formed, following the processing of FIGS. 22 and 23. Source/drain contacts 151 may be formed by forming openings in the ILD layer 137 to expose the underlying source/drain regions 133, forming silicide regions 153 over the source/drain regions 133, and filling the openings with an electrically conductive material (e.g., Cu, W, Co, Al).

The openings for the source/drain contacts 151 may be formed by performing a photolithography and etching process to etch through the CESL 135 to expose the source/drain regions 133. The silicide regions 153 may be formed by first depositing a metal capable of reacting with semiconductor materials (e.g., silicon, germanium) to form silicide or germanide regions, such as nickel, cobalt, titanium, tantalum, platinum, tungsten, other noble metals, other refractory metals, rare earth metals or their alloys, over the exposed portions of the source/drain regions 133, then performing a thermal anneal process to form the silicide regions 153. The un-reacted portions of the deposited metal are then removed, e.g., by an etching process. Next, a barrier layer may be formed lining sidewalls and bottoms of the openings in the ILD layer 137, and thereafter, a fill metal is formed to fill the openings. Additional processing may be performed after the processing of FIG. 26 to finish the GAA FET device 100, as one skilled in the art readily appreciates, thus details are not discussed here.

Note that in FIG. 26, the width of the dielectric fin 116 beyond boundaries of the gate structure 145 (e.g., directly under the source/drain regions 133) is $T_2$, which is larger than the width $T_1$ (see FIGS. 18 and 19) of the dielectric fin 116 under (e.g., directly under) the gate electrode 143. In some embodiments, the difference between $T_2$ and $T_1$ is between about 2 nm and about 20 nm.

The larger width $T_2$ of the dielectric fin 116 under the source/drain region 133 allows for larger error tolerance (or less stringent requirement) for the photolithography and etching process. For example, if the source/drain contacts 151 are shifted (e.g., to the left side or to the right side) due to inaccuracy in the photolithography and etching process to form the contact openings, the larger width $T_2$ of the dielectric fin 116 can tolerate a large amount of shift before electrical short happens between two adjacent source/drain regions 133 (e.g., 133A and 133B in FIG. 26). As another example, consider the doping (e.g., the implanting process) of the source/drain regions 133 in different regions (e.g., N-type device region 510 and P-type device region 520) for different types (e.g., N-type, or P-type) of transistors, where a patterned mask may be used to cover the source/drain regions 133 in one region (e.g., 510) while exposing another region (e.g., 520) for doping. The larger width $T_2$ allows for larger error margins for the boundary of the mask layer, which boundary may be on the top surface of the dielectric fins 116. In addition, the larger width $T_2$ of the dielectric fin 116 reduces or prevents bridging of adjacent source/drain regions (e.g., bridging between source/drain regions 133A and 133B). Furthermore, the larger width $T_2$ of the dielectric fin 116 improve the time dependent dielectric breakdown (TDDB) performance (e.g., from source/drain contact 151A to source/drain region 133B, or from source/drain contact 151B to source/drain region 133A) of the device formed. On the other hand, the smaller width $T_1$ (see FIGS. 18 and 19) of the dielectric fin 116 under the gate electrode 143 allows for easy fill of the recess 128 by the fill metal, thus improving production yield and reducing the electrical resistance of the gate structures formed.

Figure 27:
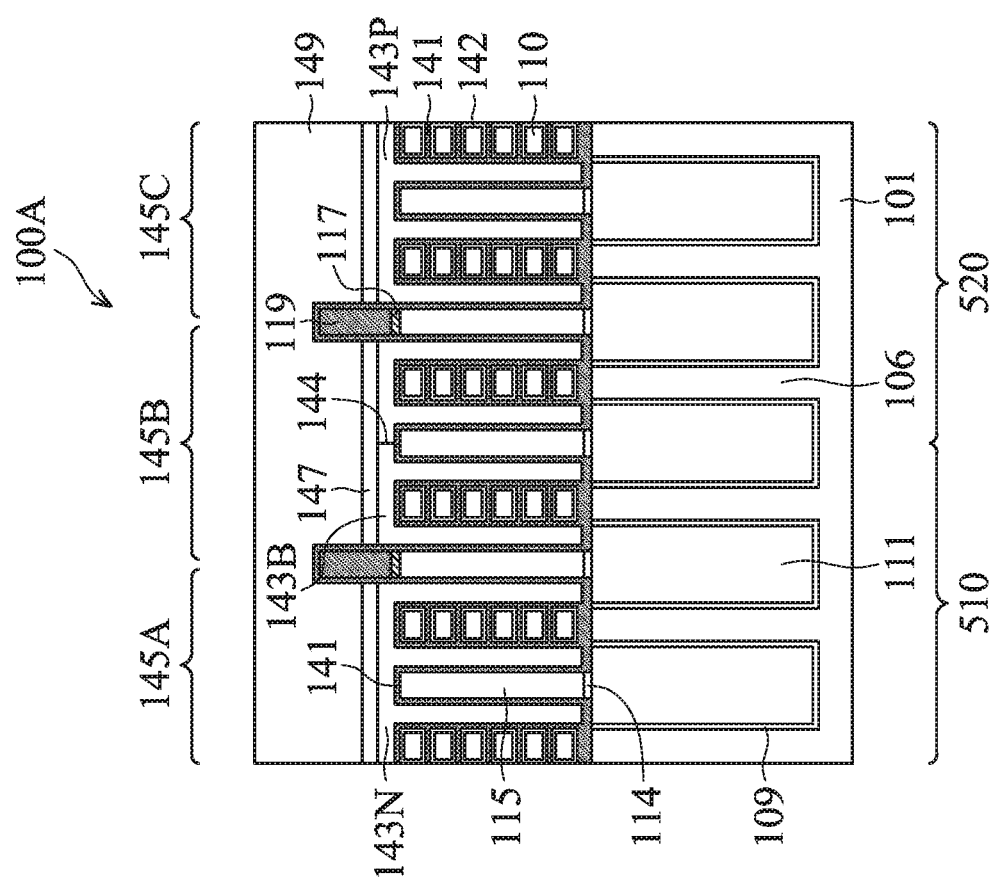
FIG. 27 is a cross-sectional view of a GAA FET device, in accordance with another embodiment.

Modifications or variations to the disclosed embodiment are possible and are fully intended to be included within the scope of the present disclosure. A few examples are illustrated in FIGS. 27 and 28. FIG. 27 is a cross-sectional view of a GAA FET device 100A, in accordance with another embodiment. The GAA FET device 100A is similar to the GAA FET device 100 in FIG. 22, but with the patterned hard mask 107 (see, e.g., FIG. 22) completely removed.

FIG. 28 is a cross-sectional view of a GAA FET device 100B, in accordance with yet another embodiment. The GAA FET device 100B is similar to the GAA FET device 100A in FIG. 27, but the gate dielectric layer 141 around vertically adjacent nanowires 110 does not merge. Instead, the gaps between vertically adjacent nanowires 110 are filled by the fill metal of the gate electrode 143. Similarly, the fill metal of the gate electrode 143 fills gaps between the bottommost nanowires 110 and the semiconductor strips 106.

Figure 29A:
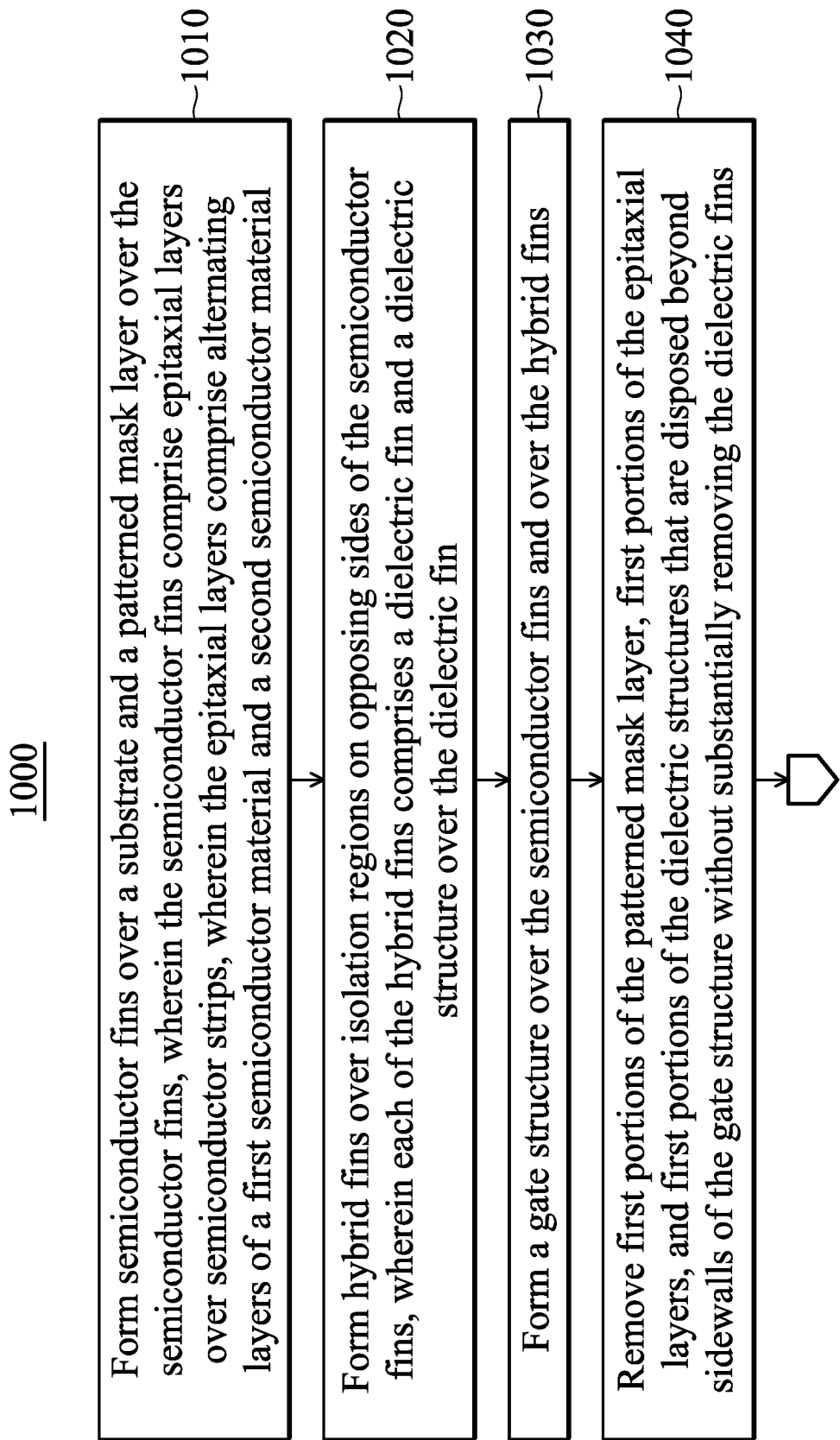
FIGS. 29A and 29B together illustrate a flow chart for a method of forming a GAA FET device, in accordance with some embodiments.
Figure 29B:
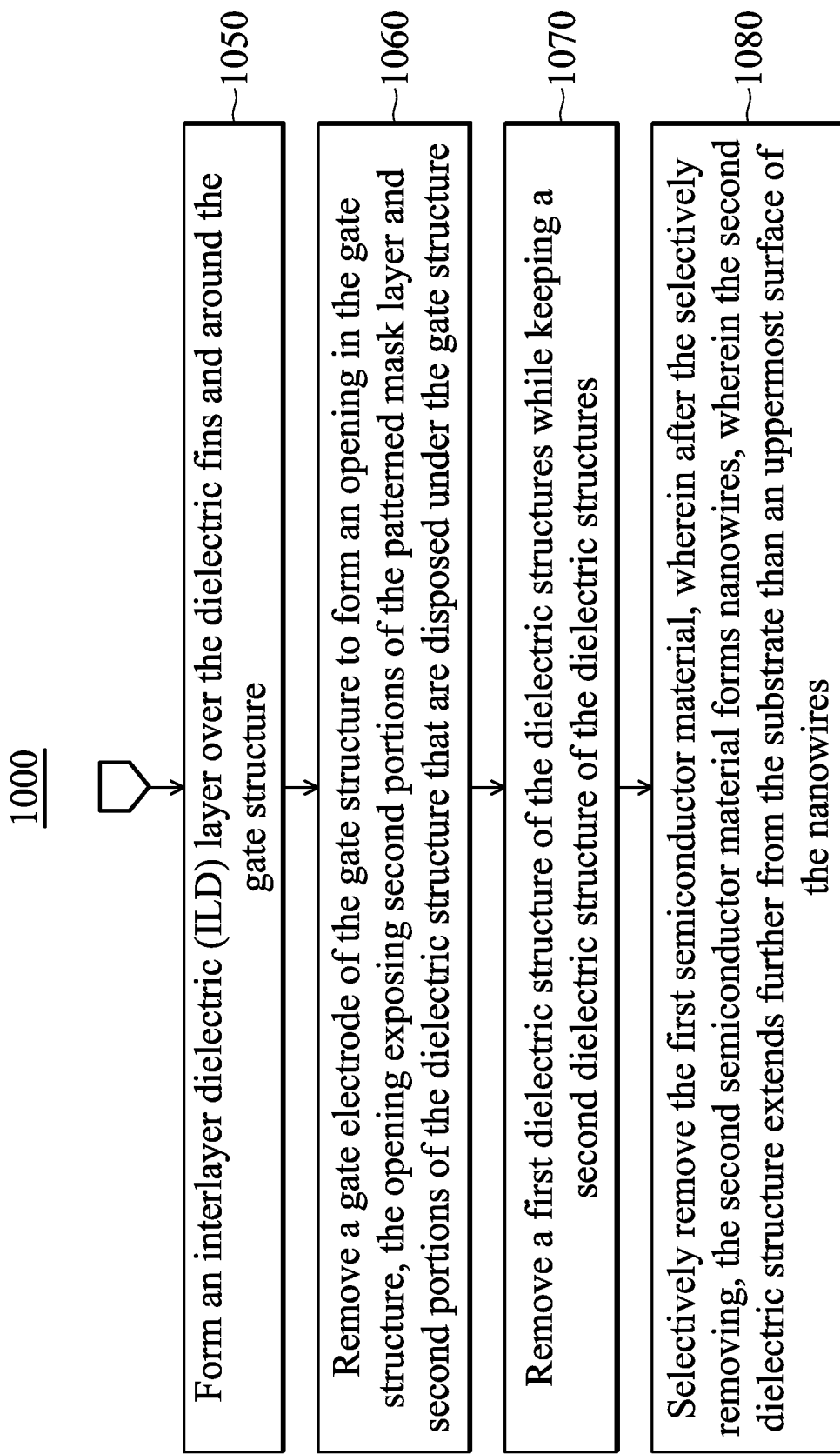

FIGS. 29A and 29B together illustrate a flow chart for a method of forming a GAA FET device, in accordance with some embodiments. It should be understood that the embodiment method shown in FIGS. 29A and 29B is merely an example of many possible embodiment methods. One of ordinary skill in the art would recognize many variations, alternatives, and modifications. For example, various steps as illustrated in FIGS. 29A and 29B may be added, removed, replaced, rearranged and repeated.

Referring to FIGS. 29A and 29B, at step 1010, semiconductor fins are formed over a substrate and a patterned mask layer is formed over the semiconductor fins, where the semiconductor fins comprise epitaxial layers over semiconductor strips, where the epitaxial layers comprise alternating layers of a first semiconductor material and a second semiconductor material. At step 1020, hybrid fins are formed over isolation regions on opposing sides of the semiconductor fins, where each of the hybrid fins comprises a dielectric fin and a dielectric structure over the dielectric fin. At step 1030, a gate structure is formed over the semiconductor fins and over the hybrid fins. At step 1040, first portions of the patterned mask layer, first portions of the epitaxial layers, and first portions of the dielectric structures that are disposed beyond sidewalls of the gate structure are removed without substantially removing the dielectric fins. At step 1050, an interlayer dielectric (ILD) layer is formed over the dielectric fins and around the gate structure. At step 1060, a gate electrode of the gate structure is removed to form an opening in the gate structure, the opening exposing second portions of the patterned mask layer and second portions of the dielectric structure that are disposed under the gate structure. At step 1070, a first dielectric structure of the dielectric structures is removed while keeping a second dielectric structure of the dielectric structures. At step 1080, the first semiconductor material is selectively removed, where after the selectively removing, the second semiconductor material forms nanowires, where the second dielectric structure extends further from the substrate than an uppermost surface of the nanowires.

Embodiments may achieve advantages. For example, the dielectric fin 116 has a larger width $T_2$ under the source/drain regions 133 and a smaller width $T_1$ under the gate electrode 143. The larger width $T_2$ provides higher error tolerance for the photolithography and etching process to form contact openings and helps to reduce electrical short between adjacent source/drain regions 133. The smaller width $T_1$ makes it easier for the fill metal to fill the recess between gate spacers 129 to form the gate electrode 143, thereby improving production yield and reducing the electrical resistance of the gate electrode. In addition, the dielectric fins 116 improve the time dependent dielectric breakdown (TDDB) performance of the device formed. Furthermore, separation of the different metal gates (e.g., 145A, 145B, 145C) is achieved by the dielectric structures 118 in a self-aligned manner. While the present disclosure is discussed in the context of GAA FET devices (e.g., nanowire devices), the principle of the disclosure may be applied to other types of devices, such as nanosheet devices or Fin Field-Effect (FinFET) devices.

In accordance with an embodiment, a method of forming a semiconductor device includes forming semiconductor fins over a substrate and a patterned mask layer over the semiconductor fins, wherein the semiconductor fins comprise epitaxial layers over semiconductor strips, wherein the epitaxial layers comprise alternating layers of a first semiconductor material and a second semiconductor material; forming hybrid fins over isolation regions on opposing sides of the semiconductor fins, wherein each of the hybrid fins comprises a dielectric fin and a dielectric structure over the dielectric fin; forming a gate structure over the semiconductor fins and over the hybrid fins; removing first portions of the patterned mask layer, first portions of the epitaxial layers, and first portions of the dielectric structures that are disposed beyond sidewalls of the gate structure without substantially removing the dielectric fins; forming an interlayer dielectric (ILD) layer over the dielectric fins and around the gate structure; removing a gate electrode of the gate structure to form an opening in the gate structure, the opening exposing second portions of the patterned mask layer and second portions of the dielectric structure that are disposed under the gate structure; removing a first dielectric structure of the dielectric structures while keeping a second dielectric structure of the dielectric structures; and selectively removing the first semiconductor material, wherein after the selectively removing, the second semiconductor material forms nanowires, wherein the second dielectric structure extends further from the substrate than an uppermost surface of the nanowires. In an embodiment, the method further includes fill the opening with an electrically conductive material; and recessing an upper surface of the electrically conductive material below an upper surface of the second dielectric structure. In an embodiment, the method further includes forming a gate dielectric material around the nanowires before filling the opening. In an embodiment, the method further includes, before filling the opening, removing at least upper layers of the second portions of the patterned mask layer exposed by the opening. In an embodiment, the method further includes, after selectively removing the first semiconductor material and before filling the opening, reducing first widths of first portions of the dielectric fins disposed under the gate structure while keeping second widths of second portions of the dielectric fins disposed beyond sidewalls of the gate structure unchanged. In an embodiment, the method further includes forming a tungsten layer on the electrically conductive material after the recessing. In an embodiment, removing first portions of the patterned mask layer, first portions of the epitaxial layers, and first portions of the dielectric structures comprises performing an anisotropic etching using the gate structure as an etching mask. In an embodiment, the method further includes, before forming the hybrid fins, forming a capping layer comprising the first semiconductor material along sidewalls of the epitaxial layers and along sidewalls of the patterned mask layer, wherein the hybrid fins are formed to contact the capping layer. In an embodiment, the dielectric fin is formed of one or more dielectric materials with a first dielectric constant, and the dielectric structure is formed of one or more dielectric materials with a second dielectric constant larger than the first dielectric constant. In an embodiment, the method further includes forming source/drain regions over the semiconductor strips after removing the first portions of the patterned mask layer, the first portions of the epitaxial layers, and the first portions of the dielectric structures and before forming the ILD layer. In an embodiment, the method further includes, after removing the first portions of the patterned mask layer, the first portions of the epitaxial layers, and the first portions of the dielectric structures and before forming the source/drain regions, replacing the first semiconductor material disposed under gate spacers of the gate structure with a first dielectric material. In an embodiment, the replacing includes: performing a lateral etch process to remove the first semiconductor material disposed under the gate spacers; and filling spaces left by the removal of the first semiconductor material using the first dielectric material.

In accordance with an embodiment, a method of forming a semiconductor device includes forming semiconductor strips protruding above a substrate; forming isolation regions between adjacent ones of the semiconductor strips; forming hybrid fins on the isolation regions, the hybrid fins comprising dielectric fins and dielectric structures over the dielectric fins; forming a dummy gate structure over the semiconductor strips and the hybrid fins; forming source/drain regions over the semiconductor strips and on opposing sides of the dummy gate structure; forming nanowires under the dummy gate structure, wherein the nanowires are over and aligned with respective semiconductor strips, and the source/drain regions are at opposing ends of the nanowires, wherein the hybrid fins extend further from the substrate than the nanowires; after forming the nanowires, reducing widths of center portions of the hybrid fins while keeping widths of end portions of the hybrid fins unchanged, wherein the center portions of the hybrid fins are under the dummy gate structure, and the end portions of the hybrid fins are beyond boundaries of the dummy gate structure; and forming an electrically conductive material around the nanowires. In an embodiment, forming the nanowires includes: before forming the dummy gate structure, forming alternating layers of a first semiconductor material and a second semiconductor material over the semiconductor strips; after forming the dummy gate structure, removing the first semiconductor material and the second semiconductor material that are disposed beyond the boundaries of the dummy gate structure; forming an interlayer dielectric layer over the source/drain regions and around the dummy gate structure; after forming the interlayer dielectric layer, removing a gate electrode of the dummy gate structure to form an opening in the dummy gate structure, the opening exposing the first semiconductor material disposed under the dummy gate structure; and selectively removing the first semiconductor material disposed under the dummy gate structure. In an embodiment, forming the nanowires further includes: before forming the dummy gate structure, forming a capping layer between the hybrid fins and the alternating layers of the first semiconductor material and the second semiconductor material, the capping layer formed using the first semiconductor material. In an embodiment, the method further includes: after removing the first semiconductor material and the second semiconductor material that are disposed beyond the boundaries of the dummy gate structure, recessing the first semiconductor material from sidewalls of remaining portions of the second semiconductor material; and filling a space left by the recessing of the first semiconductor material with a dielectric material. In an embodiment, the method further includes recessing an upper surface of the electrically conductive material below upper surfaces of the dielectric structures. In an embodiment, the method further includes forming a gate dielectric material around the nanowires before forming the electrically conductive material.

In accordance with an embodiment, a semiconductor device includes: a semiconductor strip protruding above a substrate; a first isolation region and a second isolation region on opposing sides of the semiconductor strip; nanowires over and aligned with the semiconductor strip; source/drain regions at opposing ends of the nanowires; a first dielectric fin on the first isolation region; and a metal gate around the nanowires and around center portions of the first dielectric fin, wherein end portions of the first dielectric fin are disposed on opposing sides of the metal gate, wherein the end portions of the first dielectric fin are wider than the center portions of the first dielectric fin. In an embodiment, the semiconductor device further includes a first dielectric structure over the first dielectric fin, wherein the first dielectric structure extends above an upper surface of the metal gate distal to the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
   forming semiconductor fins over a substrate and a patterned mask layer over the semiconductor fins, wherein the semiconductor fins comprise epitaxial layers over semiconductor strips, wherein the epitaxial layers comprise alternating layers of a first semiconductor material and a second semiconductor material;
   forming hybrid fins over isolation regions on opposing sides of the semiconductor fins, wherein each of the hybrid fins comprises a dielectric fin and a dielectric structure over the dielectric fin;
   forming a gate structure over the semiconductor fins and over the hybrid fins;
   removing first portions of the patterned mask layer, first portions of the epitaxial layers, and first portions of the dielectric structures that are disposed beyond sidewalls of the gate structure without substantially removing the dielectric fins;

forming an interlayer dielectric (ILD) layer over the dielectric fins and around the gate structure;

removing a gate electrode of the gate structure to form an opening in the gate structure, the opening exposing second portions of the patterned mask layer and second portions of the dielectric structure that are disposed under the gate structure;

removing a first dielectric structure of the dielectric structures while keeping a second dielectric structure of the dielectric structures; and selectively removing the first semiconductor material, wherein after the selectively removing, the second semiconductor material forms nanowires, wherein the second dielectric structure extends further from the substrate than an uppermost surface of the nanowires.

2. The method of claim 1, further comprising:
fill the opening with an electrically conductive material; and
recessing an upper surface of the electrically conductive material below an upper surface of the second dielectric structure.

3. The method of claim 2, further comprising forming a gate dielectric material around the nanowires before filling the opening.

4. The method of claim 2, further comprising, before filling the opening, removing at least upper layers of the second portions of the patterned mask layer exposed by the opening.

5. The method of claim 2, further comprising, after selectively removing the first semiconductor material and before filling the opening, reducing first widths of first portions of the dielectric fins disposed under the gate structure while keeping second widths of second portions of the dielectric fins disposed beyond sidewalls of the gate structure unchanged.

6. The method of claim 2, further comprising forming a tungsten layer on the electrically conductive material after the recessing.

7. The method of claim 1, wherein removing first portions of the patterned mask layer, first portions of the epitaxial layers, and first portions of the dielectric structures comprises performing an anisotropic etching using the gate structure as an etching mask.

8. The method of claim 1, further comprising, before forming the hybrid fins, forming a capping layer comprising the first semiconductor material along sidewalls of the epitaxial layers and along sidewalls of the patterned mask layer, wherein the hybrid fins are formed to contact the capping layer.

9. The method of claim 1, wherein the dielectric fin is formed of one or more dielectric materials with a first dielectric constant, and the dielectric structure is formed of one or more dielectric materials with a second dielectric constant larger than the first dielectric constant.

10. The method of claim 1, further comprising forming source/drain regions over the semiconductor strips after removing the first portions of the patterned mask layer, the first portions of the epitaxial layers, and the first portions of the dielectric structures and before forming the ILD layer.

11. The method of claim 10, further comprising, after removing the first portions of the patterned mask layer, the first portions of the epitaxial layers, and the first portions of the dielectric structures and before forming the source/drain regions, replacing the first semiconductor material disposed under gate spacers of the gate structure with a first dielectric material.

12. The method of claim ii, wherein the replacing comprises:
performing a lateral etch process to remove the first semiconductor material disposed under the gate spacers; and
filling spaces left by the removal of the first semiconductor material using the first dielectric material.

13. A method of forming a semiconductor device, the method comprising:
forming semiconductor strips protruding above a substrate;
forming isolation regions between adjacent ones of the semiconductor strips;
forming hybrid fins on the isolation regions, the hybrid fins comprising dielectric fins and dielectric structures over the dielectric fins;
forming a dummy gate structure over the semiconductor strips and the hybrid fins;
forming source/drain regions over the semiconductor strips and on opposing sides of the dummy gate structure;
forming nanowires under the dummy gate structure, wherein the nanowires are over and aligned with respective semiconductor strips, and the source/drain regions are at opposing ends of the nanowires, wherein the hybrid fins extend further from the substrate than the nanowires;
after forming the nanowires, reducing widths of center portions of the hybrid fins while keeping widths of end portions of the hybrid fins unchanged, wherein the center portions of the hybrid fins are under the dummy gate structure, and the end portions of the hybrid fins are beyond boundaries of the dummy gate structure; and
forming an electrically conductive material around the nanowires.

14. The method of claim 13, wherein forming the nanowires comprises:
before forming the dummy gate structure, forming alternating layers of a first semiconductor material and a second semiconductor material over the semiconductor strips;
after forming the dummy gate structure, removing the first semiconductor material and the second semiconductor material that are disposed beyond the boundaries of the dummy gate structure;
forming an interlayer dielectric layer over the source/drain regions and around the dummy gate structure;
after forming the interlayer dielectric layer, removing a gate electrode of the dummy gate structure to form an opening in the dummy gate structure, the opening exposing the first semiconductor material disposed under the dummy gate structure; and
selectively removing the first semiconductor material disposed under the dummy gate structure.

15. The method of claim 14, wherein forming the nanowires further comprises:
before forming the dummy gate structure, forming a capping layer between the hybrid fins and the alternating layers of the first semiconductor material and the second semiconductor material, the capping layer formed using the first semiconductor material.

16. The method of claim 15, further comprising:
after removing the first semiconductor material and the second semiconductor material that are disposed beyond the boundaries of the dummy gate structure, recessing the first semiconductor material from sidewalls of remaining portions of the second semiconductor material; and
filling a space left by the recessing of the first semiconductor material with a dielectric material.

17. The method of claim 13, further comprising recessing an upper surface of the electrically conductive material below upper surfaces of the dielectric structures.

18. The method of claim 13, further comprising forming a gate dielectric material around the nanowires before forming the electrically conductive material.

19. A semiconductor device comprising:
a semiconductor strip protruding above a substrate;
a first isolation region and a second isolation region on opposing sides of the semiconductor strip;
nanowires over and aligned with the semiconductor strip;
source/drain regions at opposing ends of the nanowires;
a first dielectric fin on the first isolation region; and
a metal gate around the nanowires and around a center portion of the first dielectric fin, wherein the center portion of the first dielectric fin is disposed between a lower surface of the metal gate and the substrate, wherein the lower surface of the metal gate faces the substrate and physically contacts the center portion of the first dielectric fin, wherein end portions of the first dielectric fin are disposed on opposing sides of the metal gate, wherein the end portions of the first dielectric fin are wider than the center portion of the first dielectric fin.

20. The semiconductor device of claim 19, further comprising a first dielectric structure over the first dielectric fin, wherein the first dielectric structure extends above an upper surface of the metal gate distal to the substrate.

* * * * *